United States Patent
Kono et al.

(10) Patent No.: US 11,914,385 B2
(45) Date of Patent: Feb. 27, 2024

(54) ARTICLE TRANSPORT FACILITY, ROUTE SETTING METHOD, AND ROUTE SETTING PROGRAM

(71) Applicant: Daifuku Co., Ltd., Osaka (JP)

(72) Inventors: Makoto Kono, Komaki (JP); Keisuke Takeno, Komaki (JP); Kazuhiro Iwamitsu, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 152 days.

(21) Appl. No.: 17/726,669

(22) Filed: Apr. 22, 2022

(65) Prior Publication Data
US 2022/0342423 A1    Oct. 27, 2022

(30) Foreign Application Priority Data
Apr. 23, 2021  (JP) .................................. 2021-073568

(51) Int. Cl.
*G05D 1/02* (2020.01)
*G05D 1/00* (2006.01)

(52) U.S. Cl.
CPC ......... *G05D 1/0217* (2013.01); *G05D 1/0297* (2013.01); *G05D 2201/0216* (2013.01)

(58) Field of Classification Search
CPC ............................ G05D 1/0217; G05D 1/0297
See application file for complete search history.

(56) References Cited

U.S. PATENT DOCUMENTS

| | | | |
|---|---|---|---|
| 5,625,559 A * | 4/1997 | Egawa | G05D 1/0255 701/117 |
| 9,585,038 B2 * | 2/2017 | Al-Shalash | H04W 36/32 |
| 11,087,101 B2 * | 8/2021 | Hale | G06K 19/07767 |
| 11,114,323 B2 | 9/2021 | Ogawa et al. | |
| 2007/0073552 A1 * | 3/2007 | Hileman | G06Q 10/08 705/333 |
| 2016/0335568 A1 * | 11/2016 | Bailey | G06Q 10/047 |
| 2019/0122910 A1 | 4/2019 | Ogawa et al. | |
| 2019/0135156 A1 * | 5/2019 | Huang | B60P 1/6418 |
| 2019/0258978 A1 * | 8/2019 | Mahajan | G06Q 10/06315 |
| 2020/0207230 A1 * | 7/2020 | Evans | B60L 53/34 |
| 2021/0132604 A1 * | 5/2021 | Gillett | G05D 1/0291 |
| 2022/0342423 A1 * | 10/2022 | Kono | G05D 1/0297 |

FOREIGN PATENT DOCUMENTS

JP           201980411 A       5/2019

* cited by examiner

*Primary Examiner* — Seth A Silverman
(74) *Attorney, Agent, or Firm* — The Webb Law Firm

(57) ABSTRACT

A reference cost and a variable cost are included in a link cost for setting a set route for causing a setting vehicle to travel to a destination on a travelable route. A controller obtains an adjusted variable cost by adjusting a variable cost using a priority adjustment value set higher as a priority for arriving more quickly at a destination decreases, determines a link cost for each link in a candidate route, which is a candidate for a set route for a setting vehicle, based on the adjusted variable cost and the reference cost, obtains a route cost for each candidate route based on the link costs, and sets the set route based on the route costs of the candidate routes.

10 Claims, 10 Drawing Sheets

ARTICLE TRANSPORT FACILITY, ROUTE SETTING METHOD, AND ROUTE SETTING PROGRAM

CROSS-REFERENCE TO RELATED APPLICATION

This application claims priority to Japanese Patent Application No. 2021-073568 filed Apr. 23, 2021, the disclosure of which is hereby incorporated by reference in its entirety.

BACKGROUND OF THE INVENTION

1. Field of the Invention

The present invention relates to an article transport facility provided with article transport vehicles that travel along a specified travelable route and transport articles and a controller for controlling the article transport vehicles, and also relates to a route setting method and a route setting program for route setting in the article transport facility.

2. Description of the Related Art

JP 2019-080411A discloses a known example of such an article transport facility. The controller of this article transport facility executes route setting control for setting a set route, which is a route for traveling of the article transport vehicle from the current position to a destination on a travelable route. For example, in the case of transporting an article from a transport source to a transport destination, if the article transport vehicle is present at a position corresponding to the transport source, the controller performs the route setting control so as to set the set route such that a position corresponding to the transport source is the current position and a position corresponding to the transport destination is the destination.

SUMMARY OF THE INVENTION

In the above-described article transport facility, when setting the set route in the route setting control as described above, there may be a plurality of candidate routes that are candidates for the set route from the current position of the article transport vehicle to the destination. In such a case, it is conceivable that the set route that is set by the controller in the route setting control is the candidate route that has the shortest route length or the candidate route that reaches the destination in the shortest time among a plurality of candidate routes. However, it is often the case that a plurality of article transport vehicles are traveling in an article transport facility. The article transport vehicles have various traveling purposes, from high-priority purposes to low-priority purposes in terms of the article transport facility. If the setting route of each article transport vehicle is set using a uniform setting criterion, an article transport vehicle having a lower priority can possibly be assigned a set route that has a shorter route length or reaches the destination in a shorter time than a set route assigned to an article transport vehicle having a higher priority. This can possibly cause a reduction in the overall operating efficiency of the article transport facility.

In view of this, an object of the present invention is to provide technology that can appropriately set, from a plurality of candidate routes, a set route that enables an article transport vehicle having a high-priority traveling purpose to preferentially travel via an efficient route and reach a destination more quickly.

In view of the foregoing, an article transport facility according to an aspect of the present invention includes: a plurality of article transport vehicles configured to transport articles while traveling along a specified travelable route; and a controller configured to control the article transport vehicles, wherein the travelable route includes a plurality of nodes at which a route branches or routes merge, and a plurality of links that are each a route portion connecting a pair of nodes, the controller executes route setting control to set a set route based on a link cost set for each of the links, the set route being a route along which a setting vehicle, which is one of the plurality of article transport vehicles, travels to a destination on the travelable route, each of the link costs includes a reference cost and a variable cost, with a target vehicle being any one article transport vehicle that passes through a link, a target link being the link through which the target vehicle passes, and another vehicle being an article transport vehicle other than the target vehicle, the reference cost is a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, in the route setting control, the controller obtains the variable cost based on the number of target other vehicles and the other vehicle cost, obtains an adjusted variable cost by adjusting the variable cost using the priority adjustment value that is in accordance with the traveling purpose of the setting vehicle, determines the link cost for each link in a candidate route based on the adjusted variable cost and the reference cost, the candidate route being a candidate for the set route from the position of the setting vehicle at the setting time to the destination, obtains a route cost for each candidate route based on the link costs, and sets the set route based on the route cost of each candidate route.

According to this configuration, the adjusted variable cost is adjusted so as to increase as the priority for arriving more quickly at the destination decreases, in accordance with the traveling purpose of the setting vehicle. As a result, in the case of a setting vehicle having a low-priority traveling purpose, if a candidate route passes through a link that can possibly include many target other vehicles and be congested, the cost of that candidate route is higher than that in the case of a setting vehicle having a high-priority traveling purpose. For this reason, it is more likely for an article transport vehicle having a low-priority traveling purpose to take a route that avoids a link that may be congested, and it is possible to easily suppress the actual congestion level in the link that may be congested. As a result, it is easier to increase the degree of freedom when setting the set route of an article transport vehicle having a high-priority traveling purpose. Accordingly, it is possible to appropriately set, from a plurality of candidate routes, a set route that enables an article transport vehicle having a high-priority traveling purpose to preferentially travel via an efficient route and reach a destination more quickly.

Various technical features of the article transport facility described above can also be applied to a route setting method or a route setting program in an article transport facility. The following illustrates a representative embodiment. For example, the route setting method can include various steps that have the features of the article transport facility described above. Also, the route setting program can cause a controller, which is a computer, to realize various functions having the features of the article transport facility described above. As a matter of course, the route setting method and the route setting program can also achieve the operations and effects of the article transport facility described above. Furthermore, as a preferred aspect of the article transport facility, various additional features illustrated in the following description of embodiments can also be incorporated into the route setting method and the route setting program, and the method and the program can also achieve operations and effects that correspond to the additional features.

As one preferred aspect, a route setting method is for, in an article transport facility that includes a plurality of article transport vehicles that transport articles while traveling along a specified travelable route and a controller that controls the article transport vehicles, setting a set route for causing a setting vehicle, which is one of the article transport vehicles, to travel to a destination on the travelable route, by causing the controller to execute route setting control, the travelable route including a plurality of nodes at which a route branches or routes merge, and a plurality of links that are each a route portion connecting a pair of nodes, a link cost set for each of the links including a reference cost and a variable cost, with a target vehicle being any one article transport vehicle that passes through a link, a target link being the link through which the target vehicle passes, and another vehicle being an article transport vehicle other than the target vehicle, the reference cost being a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, the route setting method including: a step of obtaining the variable cost based on the number of target other vehicles and the other vehicle cost; a step of obtaining an adjusted variable cost by adjusting the variable cost using the priority adjustment value that is in accordance with the traveling purpose of the setting vehicle; a step of determining the link cost for each link in a candidate route based on the adjusted variable cost and the reference cost, the candidate route being a candidate for the set route from the position of the setting vehicle at the setting time to the destination; a step of obtaining a route cost for each candidate route based on the link costs; and a step of setting the set route based on the route cost of each candidate route.

Also, as another preferred aspect, a route setting program is for, in an article transport facility that includes a plurality of article transport vehicles that transport articles while traveling along a specified travelable route and a controller that controls the article transport vehicles, causing the controller to realize a function for setting a set route for causing a setting vehicle, which is one of the article transport vehicles, to travel to a destination on the travelable route, by execution of route setting control by the controller, the travelable route including a plurality of nodes at which a route branches or routes merge, and a plurality of links that are each a route portion connecting a pair of nodes, a link cost set for each of the links including a reference cost and a variable cost, with a target vehicle being any one article transport vehicle that passes through a link, a target link being the link through which the target vehicle passes, and another vehicle be an article transport vehicle other than the target vehicle, the reference cost being a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, the route setting program causing the controller to realize: a function of obtaining the variable cost based on the number of target other vehicles and the other vehicle cost; a function of obtaining an adjusted variable cost by adjusting the variable cost using the priority adjustment value that is in accordance with the traveling purpose of the setting vehicle; a function of determining the link cost for each link in a candidate route based on the adjusted variable cost and the reference cost, the candidate route being a candidate for the set route from the position of the setting vehicle at the setting time to the destination; a function of obtaining a route cost for each candidate route based on the link costs; and a function of setting the set route based on the route cost of each candidate route.

Further features and advantages of an article transport facility as well as a route setting method and a route setting program for route setting in the article transport facility will become apparent from the following description of exemplary and non-limiting embodiments given with reference to the drawings.

DESCRIPTION OF THE INVENTION

Figure 1:
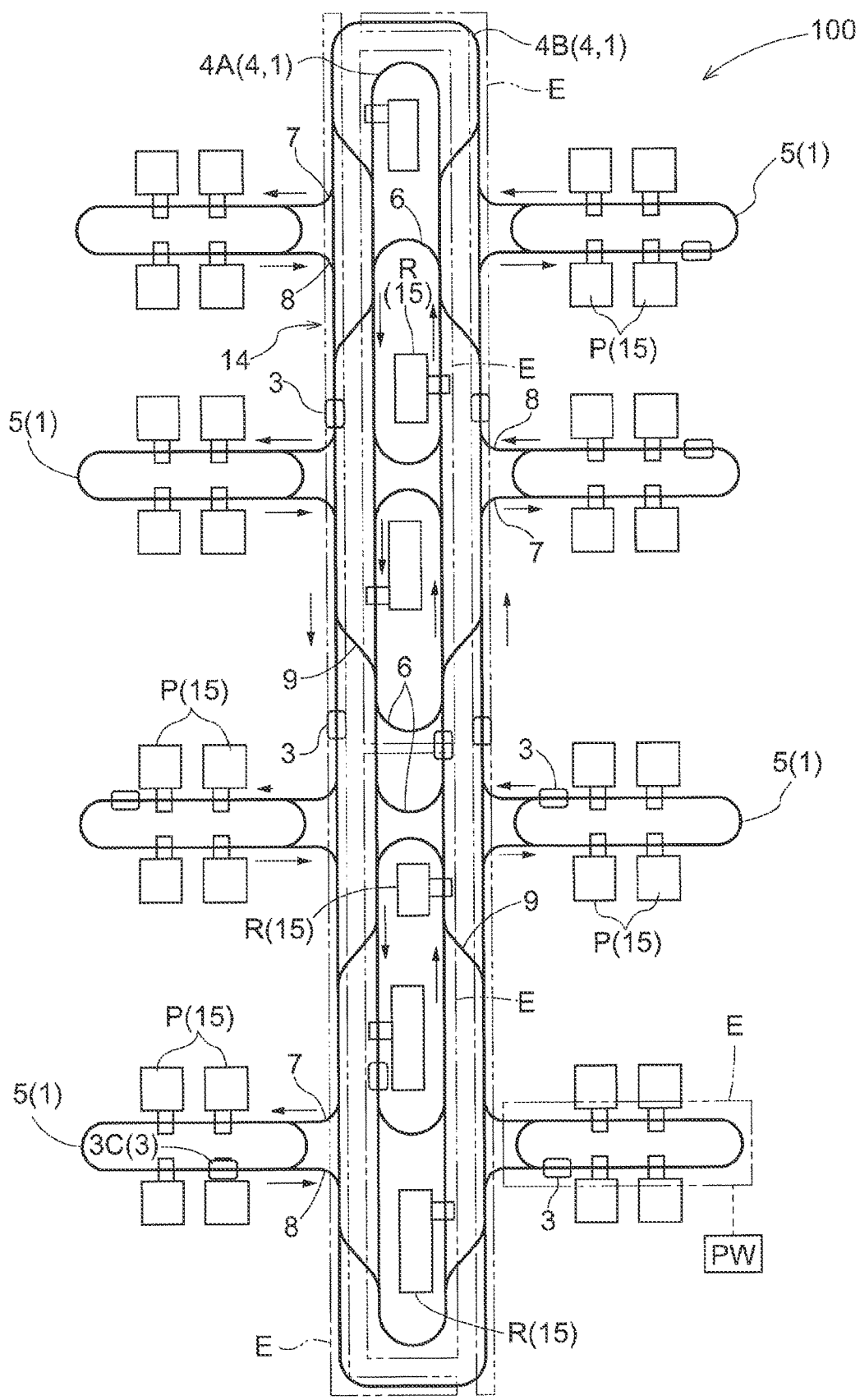
FIG. 1 is a plan view of an article transport facility.

Embodiments of an article transport facility as well as a route setting method and a route setting program in an article transport facility will be described below with reference to the drawings. As shown in FIG. 1, the article transport facility includes article transport vehicles 3 that travel along a specified travelable route 1 and transport articles W, and a controller H that controls the article transport vehicles 3 (see FIG. 5). In the present embodiment, traveling rails 2 (see FIGS. 2 and 3) are disposed along the specified travelable route 1, a plurality of article transport vehicles 3 are provided, and the article transport vehicles 3 travel in one direction along the travelable route 1 on the traveling rails 2. As shown in FIG. 4, the traveling rails 2 are each constituted by a pair of left and right rail portions 2A. Note that in the present embodiment, the article transport vehicles 3 each transport an FOUP (Front Opening Unified Pod) that houses a semiconductor substrate serving as the article W.

As shown in FIG. 1, the travelable route 1 includes two main routes 4 and a plurality of sub-routes 5 that pass by a plurality of article processing apparatuses P. The two main routes 4 and the sub-routes 5 are each shaped as a loop. The two main routes 4 are provided in a concentric loop state. These two loop-shaped main routes 4 are routes on which the article transport vehicles 3 travel in the same direction (counterclockwise). In FIG. 1, the traveling directions of the article transport vehicles 3 are indicated by arrows.

Out of the two main routes 4, the inner main route 4 will be referred to as a first main route 4A, and the outer main route 4 will be referred to as a second main route 4B. The first main route 4A is set to pass by a plurality of storage units R. The first main route 4A is used as an article transfer route for stopping an article transport vehicle 3 in order to transfer an article W to or from a storage unit R. On the other hand, the second main route 4B is used as a continuous traveling route for allowing the article transport vehicles 3 to travel continuously.

The travelable route 1 includes shortcut routes 6, branch routes 7, merge routes 8, and transit routes 9. The shortcut routes 6 are each connected to each of a pair of parallel straight portions of the first main route 4A. The shortcut route 6 is a route for allowing an article transport vehicle 3 to travel from a first one of the pair of straight portions of the first main route 4A to the second straight portion, or from the second one to the first one. The branch routes 7 are each connected to the second main route 4B and a sub-route 5, and are routes for allowing the article transport vehicles 3 to travel from the second main route 4B to the sub-routes 5. The merge routes 8 are each connected to a sub-route 5 and the second main route 4B, and are routes for allowing the article transport vehicles 3 to travel from the sub-routes 5 to the second main route 4B. The transit routes 9 are each connected to the first main route 4A and the second main route 4B, and are routes for allowing the article transport vehicles 3 to travel from the first main route 4A to the second main route 4B or from the second main route 4B to the first main route 4A.

Figure 2:
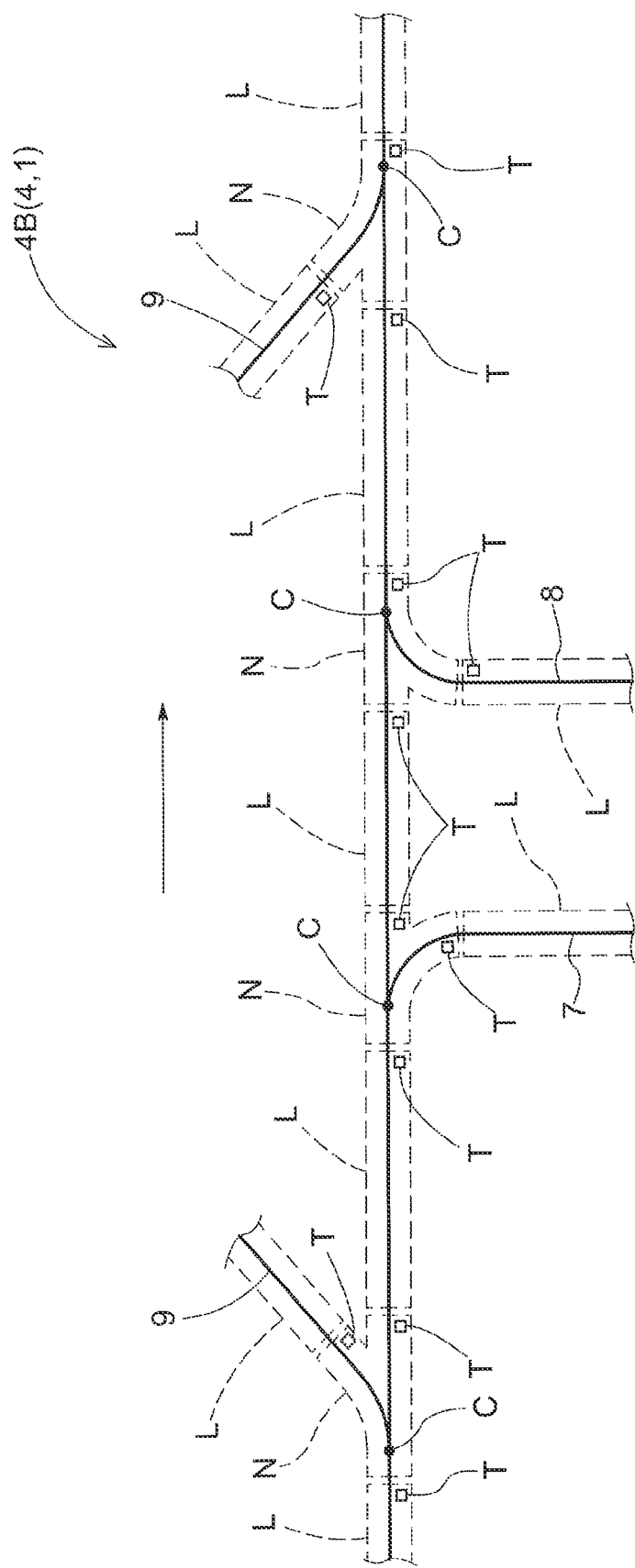
FIG. 2 shows nodes and links of a travelable route.

As shown in FIG. 2, the travelable route 1 includes a plurality of nodes N at which a route branches or routes merge, and a plurality of links L, which are each a route portion that connects a pair of nodes N. In the present embodiment, a node N is a route portion corresponding to a specified range extending upstream and downstream from a connection point C where a route branches or two routes merge. In the example of the portion of the second main route 4B shown in FIG. 2, in the case where the connection point C is the point where a transit route 9 branches from or merges with the second main route 4B, the node N corresponds to a specified range extending from the connection point C in the second main route 4B and the transit route 9. Also, in the case where the connection point C is the point where a branch route 7 branches from the second main route 4B, the node N corresponds to a specified range extending from the connection point C in the second main route 4B and the branch route 7. Also, in the case where the connection point C is the point where a merge route 8 merges with the second main route 4B, the node N corresponds to a specified range extending from the connection point C in the second main route 4B and the merge route 8. The link L is a route portion that is between a pair of nodes N in the second main route 4B and is connected to the pair of nodes N. In the present embodiment, the specified range extending from the connection point C is set based on the positions of a plurality of detection objects T disposed along the travelable route 1, as will be described later. In other words, the detection objects T are each disposed at a position corresponding to the boundary between a node N and a link L.

Figure 3:
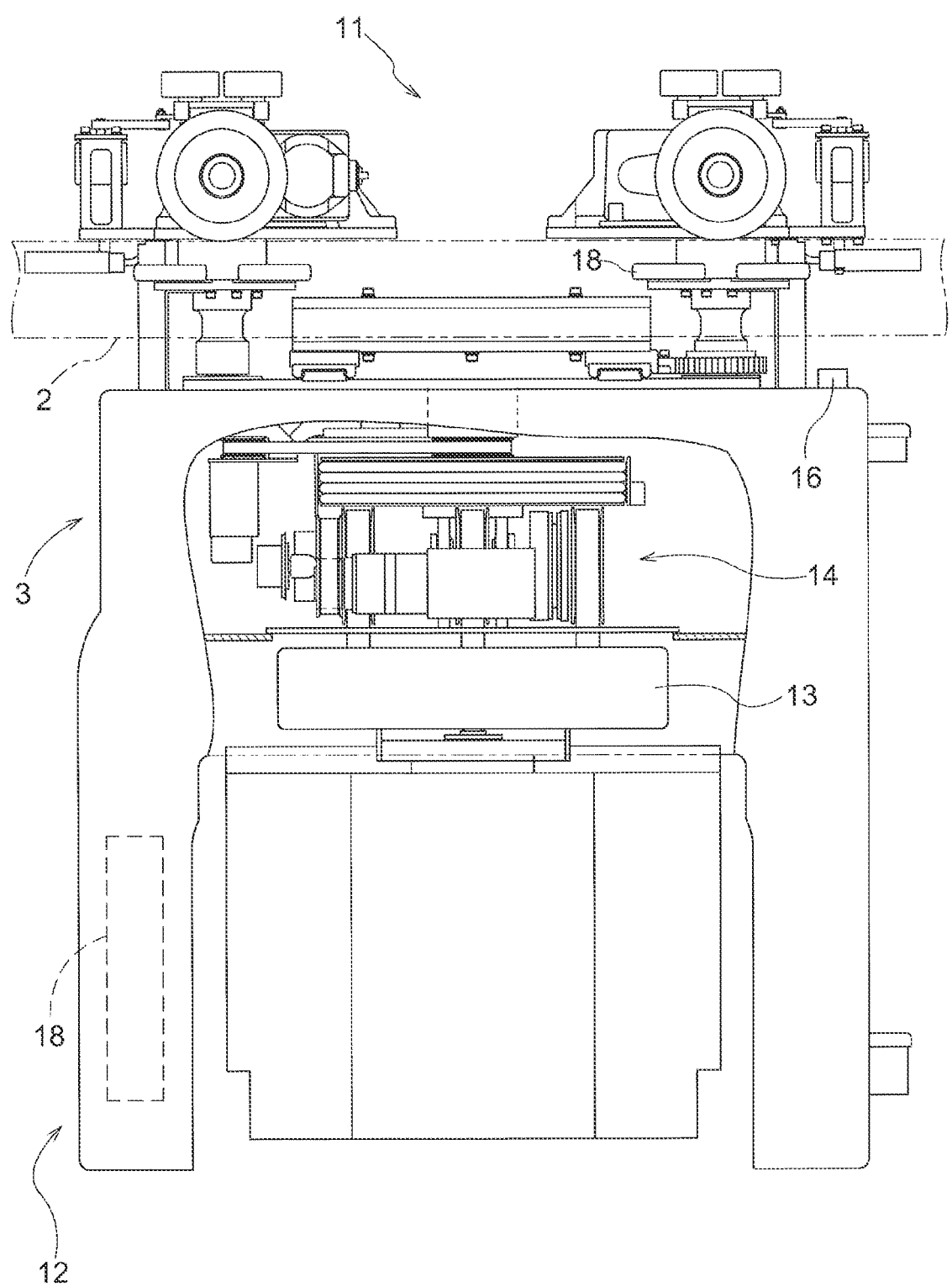
FIG. 3 is a side view of an article transport vehicle.
Figure 4:
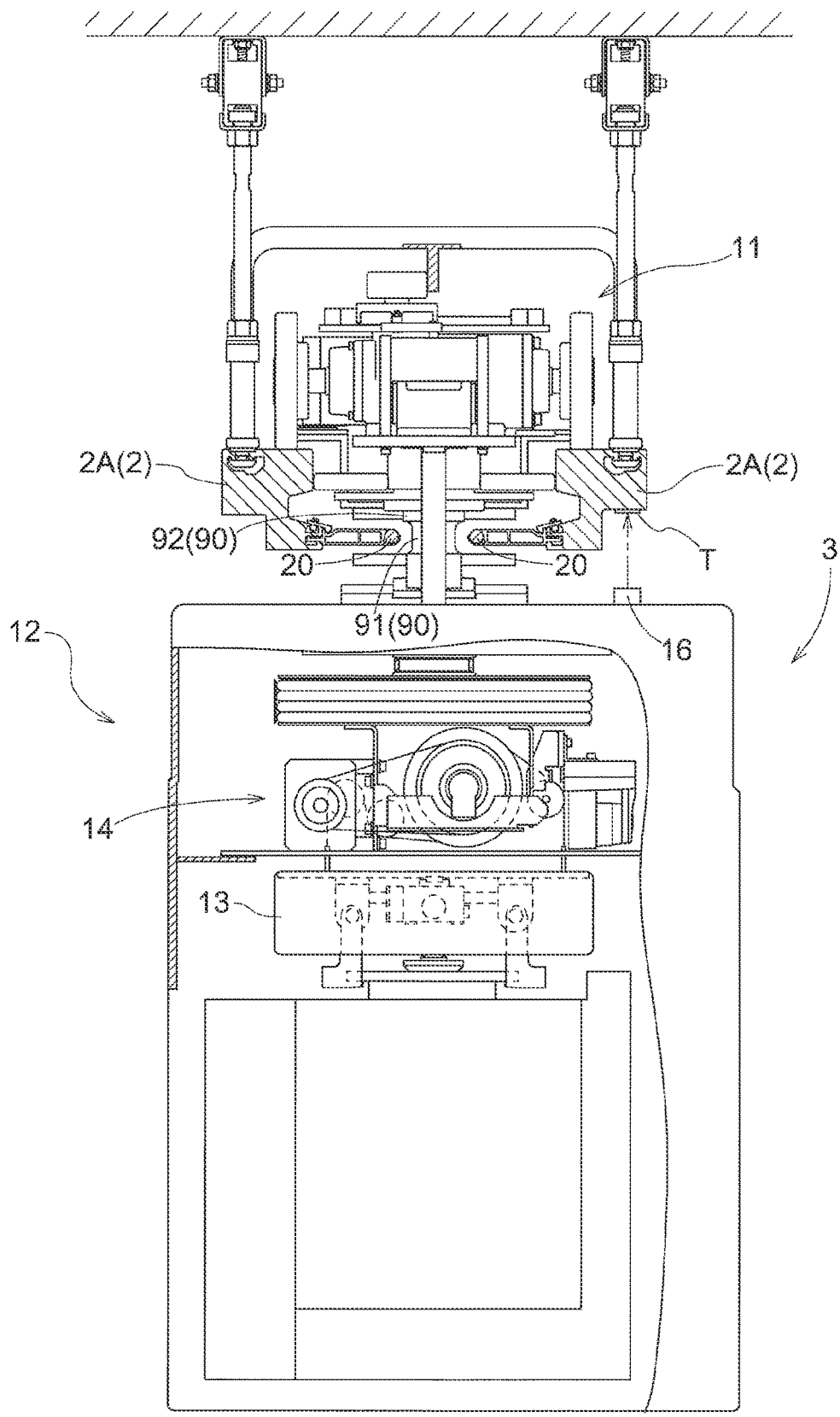
FIG. 4 is a front view of the article transport vehicle.

As shown in FIGS. 3 and 4, the article transport vehicle 3 includes a traveling portion 11 that travels along a traveling rail 2, which is suspended from and supported by the ceiling, at a position above the traveling rail 2, a main body portion 12 that is located below the traveling rail 2 and is suspended from and supported by the traveling portion 11, and a power receiving portion 90 for contactlessly receiving drive power supplied by power supply lines 20 disposed along the travelable route 1. The main body portion 12 includes a support mechanism 13 that supports an article W in a suspended state, and an elevating mechanism 14 that moves the support mechanism 13 in the vertical direction relative to the main body portion 12. In the case where an article processing apparatus P or a storage unit R is a transport-source transfer target location 15 (see FIG. 1), the article transport vehicle 3 travels to a position corresponding to the transport-source transfer target location 15, retrieves an article W at the transport-source transfer target location 15, and transfers the article W from that transfer target location 15 to the interior of the main body portion 12. Thereafter, the article transport vehicle 3 travels to a position corresponding to a transport-destination transfer target location 15, and transfers the article W supported by the support mechanism 13 from the interior of the main body portion 12 to the transport-destination transfer target location 15. As a result, the article W is transported from the transport-source transfer target location 15 to the transport-destination transfer target location 15. At this time, in the present embodiment, the article transport vehicle 3 travels at a first speed when traveling on a straight route, and travels at a second speed, which is lower than the first speed, when traveling on a curved route.

As shown in FIG. 4, the power supply lines 20 are respectively supported by the pair of rail portions 2A that constitute the traveling rail 2, and are arranged along the travelable route 1 (traveling rail 2). In the present embodiment, the power supply lines 20 extend in the horizontal direction and are arranged on both sides of the power receiving portion 90 in a direction orthogonal to the extending direction of the travelable route 1 (traveling rail 2). In the present embodiment, the power receiving portion 90 supplies drive power to the article transport vehicle 3 with use of a wireless power feeding technology called HID (High Efficiency Inductive Power Distribution Technology). Specifically, a high-frequency current is applied to the power supply lines 20, which are induction wires, and thus a magnetic field is generated around the power supply lines 20. The power receiving portion 90 includes a pickup coil 91, and an AC voltage is induced in the pickup coil 91 due to electromagnetic induction from the magnetic field. The power receiving portion 90 includes a power receiving circuit (not shown) that includes a full-wave rectifier circuit and a smoothing capacitor, and the induced AC voltage is rectified to a DC voltage.

If one system is used to supply power over the entirety of the article transport facility 100, the amount of power loss may be high, or a voltage drop or power failure may occur over the entire area if a failure occurs in the power supply lines 20 or a power supply device PW (see FIG. 1) that supplies power to the power supply lines 20. For this reason, as shown in FIG. 1, in the present embodiment, the travelable route 1 in the article transport facility 100 is divided into a plurality of power supply areas E. An area maximum number of vehicles is set for each power supply area E, and the number of article transport vehicles 3 to which power is supplied in each power supply area E is less than or equal to the area maximum number of vehicles. The controller H controls the traveling of the article transport vehicles 3 such that the number of article transport vehicles 3 in each power supply area E is less than or equal to the area maximum number of vehicles in the corresponding power supply area E.

Note that for the sake of simplification, FIG. 1 shows one power supply area E for one sub-route 5, but in the present embodiment, one power supply area E is set for each sub-route 5. Similarly, for simplification, FIG. 1 shows a mode in which one power supply device PW is provided in the power supply area E set for the one sub-route 5, but at least one power supply device PW is provided for each power supply area E.

Figure 5:
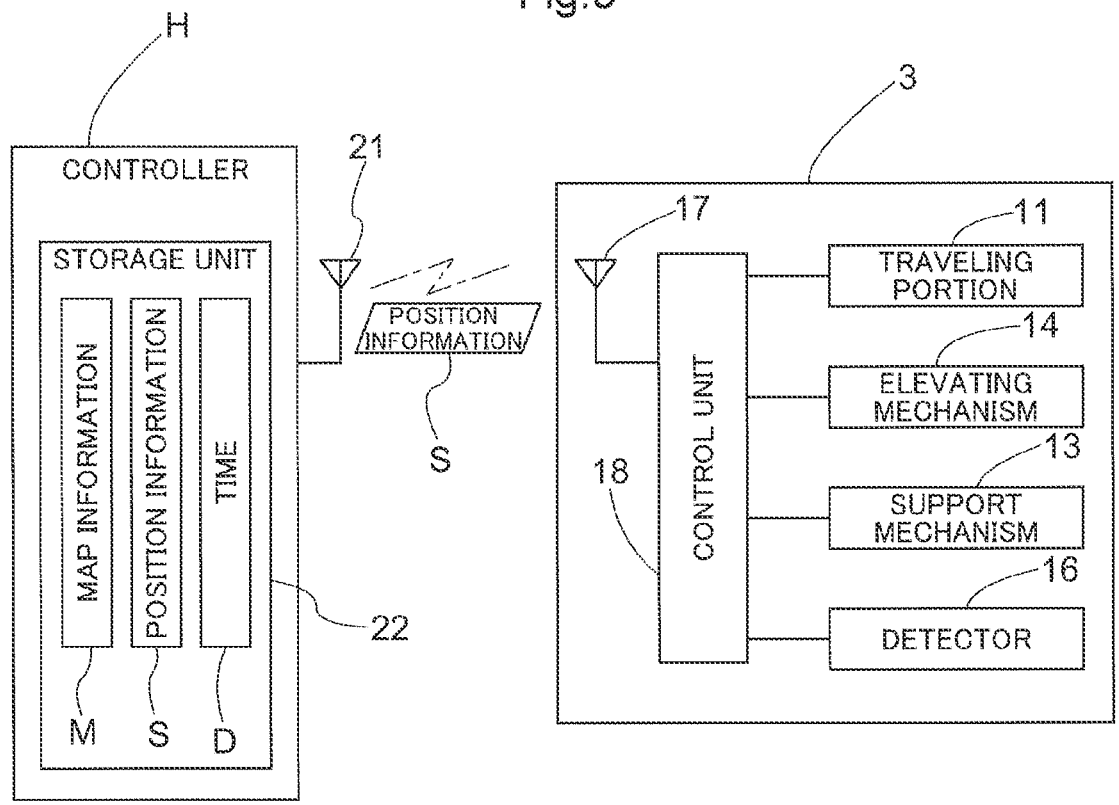
FIG. 5 is a control block diagram.

As shown in FIG. 5, the article transport vehicle 3 includes a detector 16, a transmission/reception device 17, and a control unit 18. The detector 16 detects detection objects T (see FIGS. 2 and 4) that are disposed along the travelable route 1. Each detection object T has position information indicating the position where the detection object T is disposed, and the detector 16 reads the position information of the detection object T. A plurality of detection objects T are disposed along the travelable route 1, and more specifically are disposed at connection points between nodes N and links L, positions corresponding to the transfer target locations 15, and the like. The transmission/reception device 17 reads the position information of a detection object T detected by the detector 16, and transmits the read position information S to a transmission/reception unit 21 of the controller H as necessary. Specifically, the article transport vehicle 3 transmits position information S to the controller H when entering a link L, exiting a link L, and reaching a position corresponding to a transfer target location 15. The position information S transmitted by the article transport vehicle 3 to the controller H corresponds to position information S that indicates the position of that article transport vehicle 3. Also, the article transport vehicles 3 each transmit position information S indicating their position to the controller H. The transmission/reception device 17 also receives information transmitted by the transmission/reception unit 21 of the controller H.

The controller H includes a storage unit 22 that stores map information M regarding the travelable route 1, which is information regarding the links L and the nodes N that make up the travelable route 1 as described above. The storage unit 22 also stores the position information S received from the article transport vehicles 3 in association with a corresponding time D. In the present embodiment, the controller H stores the time D when position information S is received from the transmission/reception device 17 of an article transport vehicle 3, in association with the position information S. Note that if the article transport vehicles 3 are configured to transmit time information that indicates the time D when the position information S of the detection object T was read, to the controller H together with the position information S, the controller H may store the time D shown in that time information in the storage unit 22 in association with the position information S. The controller H acquires number of vehicles information based on the positions of the article transport vehicles 3 at respective time points, which are obtained based on the information stored in the storage unit 22. The controller H can acquire the position of each of the article transport vehicles 3 on the travelable route 1 based on the position information S received from the article transport vehicles 3.

For example, in the time period from reception of position information S that is transmitted when an article transport vehicle 3 enters a link L (or exits the node N upstream of that link L) until reception of position information S that is transmitted when the article transport vehicle 3 exits that link L, the controller H can determine that the article transport vehicle 3 is present in the link L whose entrance corresponds to the received position information S. Also, in the case where a transfer target location 15 is located in a link L, if position information S transmitted upon arrival at the transfer target location 15 has not been received from an article transport vehicle 3 determined to be present in the link L, it can be determined that the article transport vehicle 3 is located upstream of the transfer target location 15 in the link L, and if the position information S has been received, it can be determined that the article transport vehicle 3 is located at the transfer target location 15 or downstream thereof in the link L. In this way, the controller H acquires the number of article transport vehicles 3 located in each of the links L based on the positions of the plurality of article transport vehicles 3 at respective time points. At this time, in the case of a link L that includes a transfer target location 15, the controller H acquires the number of article transport vehicles 3 located upstream of the transfer target location 15 in the link L and the number of article transport vehicles 3 located downstream of the transfer target location 15 in the link L.

As described above, the controller H stores the map information M in the storage unit 22. The map information M includes basic map information, which includes information indicating the positions and connection relationships of the links L and the nodes N along the travelable route 1, attribute information indicating attributes of the links L and the nodes N, and information indicating the shapes of the links L and the shapes of the nodes N. The map information also includes travel control information in which various types of information necessary for traveling of the article transport vehicles 3, such as position information S for a plurality of points on the travelable route 1, is associated with the basic map information.

Figure 6:
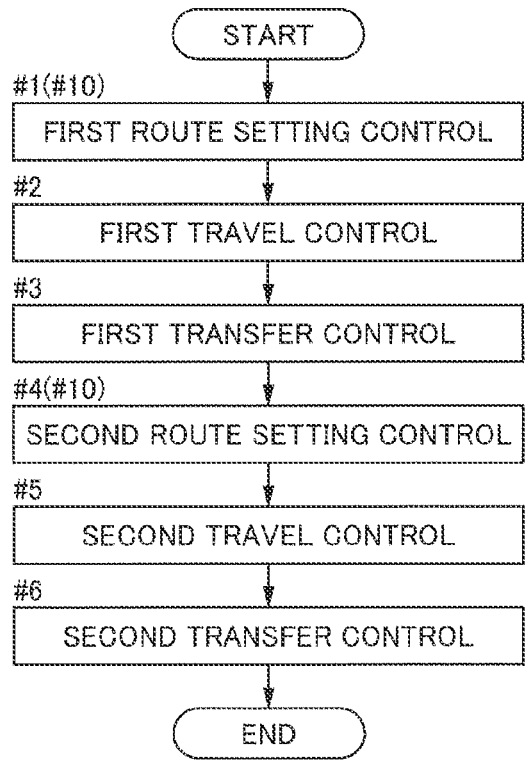
FIG. 6 is a flowchart of transport control.

In the case of transporting an article W from a transport source to a transport destination, as shown in the flowchart of transport control in FIG. 6, the controller H sequentially executes: first route setting control #1 for setting a first set route for causing an article transport vehicle 3 to travel from a current position to a position (destination) corresponding to a transport-source transfer target location 15 based on the basic map information; first travel control #2 for causing the article transport vehicle 3 to travel along the first set route and reach a position corresponding to the transport-source transfer target location 15; first transfer control #3 for transferring the article W at the transport-source transfer target location 15 to the main body portion 12; second route setting control #4 for setting a second set route for causing the article transport vehicle 3 to travel from the current position to a position (destination) corresponding to a transport-destination transfer target location 15 based on the basic map information; second travel control #5 for causing the article transport vehicle 3 to travel along the second set route and reach a position corresponding to the transport-destination transfer target location 15; and second transfer control #6 for transferring the article W in the main body portion 12 to the transport-destination transfer target location 15.

The first route setting control #1 and the second route setting control #4 are similar types of control, and will be simply referred to as route setting control #10 when there is no need to distinguish between them. In other words, the route setting control #10 includes the first route setting control #1 and the second route setting control #4. Therefore, a set route 1A includes the first set route and the second set route described above.

Figure 8:
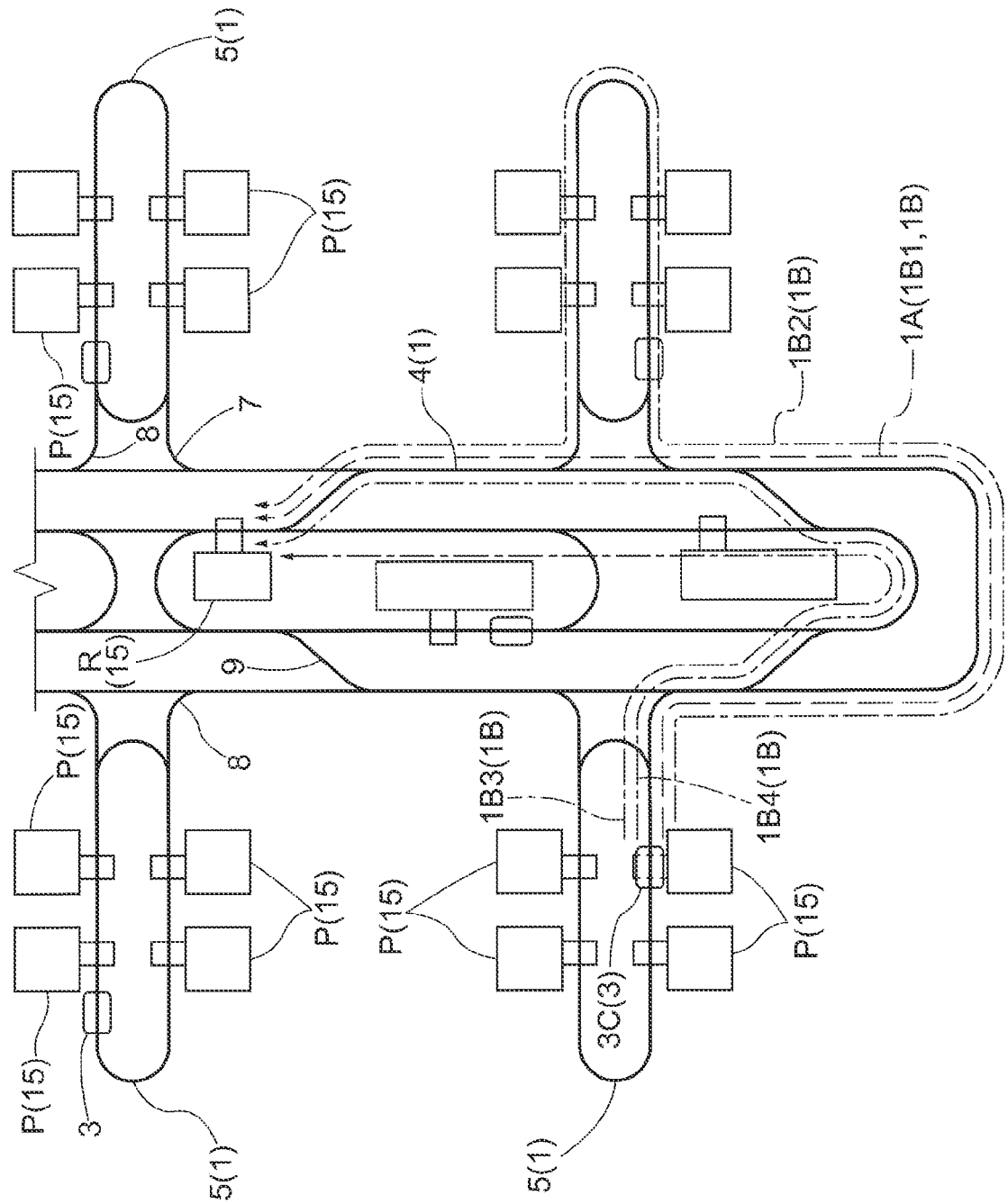
FIG. 8 is a diagram showing an example of a set route and candidate routes for an article transport vehicle.

As shown in FIG. 8, there can be multiple routes from the current position to a destination. In other words, there are a plurality of candidate routes 1B that are candidates for the set route 1A. FIG. 8 illustrates four candidate routes 1B, namely a first candidate route 1B1, a second candidate route 1B2, a third candidate route 1B3, and a fourth candidate route 1B4. If a plurality of candidate routes 1B exist, the controller H determines one set route 1A from among the candidate routes 1B. In the example shown in FIG. 8, the first candidate route 1B1 has been set as the set route 1A.

The controller H executes the route setting control #10 for setting the set route 1A (e.g., the first candidate route 1B1 indicated by dashed lines in FIG. 8) for causing the article transport vehicle 3 to travel from the current position to a destination on the travelable route 1, based on link costs LC set for the links L. The link costs LC each include a reference cost ST, which is a static (fixed) cost, and a variable cost DY, which is a dynamic cost, and the link cost LC is calculated using the following expression (1). The link cost LC will be described later.

$$LC = ST + DY \quad (1)$$

Figure 7:
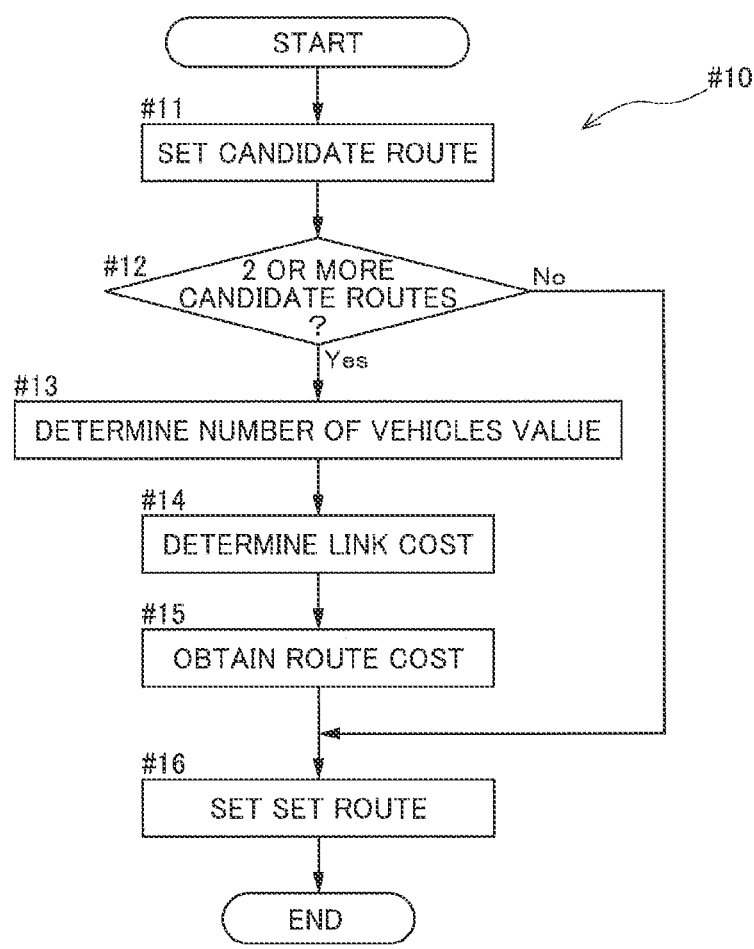
FIG. 7 is a flowchart of route setting control.

In the present embodiment, as shown in the flowchart of the route setting control #10 in FIG. 7, based on current position information of a setting vehicle 3C, destination information, and the map information, the controller H sets one or more candidate routes 1B as routes that enable traveling from the current position to the destination (#11). Next, the controller H determines whether or not two or more set candidate routes 1B were set (#12). If only one candidate route 1B was set, the controller H sets the candidate route 1B as the set route 1A (#15). If two or more candidate routes 1B were set, the controller H first determines a number of vehicles value n for each of all of the links L that belong to the candidate routes 1B (#13). The method for determining the number of vehicles value n will be described later. Next, the controller H determines the link cost LC for each of all of the links L that belong to the candidate routes 1B based on the reference cost ST and the variable cost DY that corresponds to the number of vehicles value n (#14). Then, for each of the candidate routes 1B, the controller H obtains a route cost TC, which is the total cost of the candidate route 1B, based on the link costs LC of the links L that belong to the candidate route 1B (#15), and sets one set route 1A from among the two or more candidate routes 1B based on the route costs TC of the candidate routes 1B (#16).

The controller H repeatedly executes the route setting control #10 at least at a regular time interval. As the setting vehicle 3C approaches a target link LA, the actual influence of other vehicles 3B approaches the actual state. For this reason, if the route setting control #10 is repeatedly executed at a regular time interval, the route setting can be reviewed while the setting vehicle 3C is moving, and the route setting can be performed more precisely based on the influence of other vehicles 3B.

The following describes the link cost LC and the number of vehicles value n. Here, the setting vehicle 3C is defined as the article transport vehicle 3 for which the set route 1A is to be set in the route setting control #10. Also, the target vehicle 3A is defined as an article transport vehicle 3 that passes through a link L on the candidate route 1B of the setting vehicle 3C, and the target link LA is defined as the link L through which the target vehicle 3A passes. Also, the other vehicle 3B is defined as an article transport vehicle 3 other than the target vehicle 3A.

Figure 9:
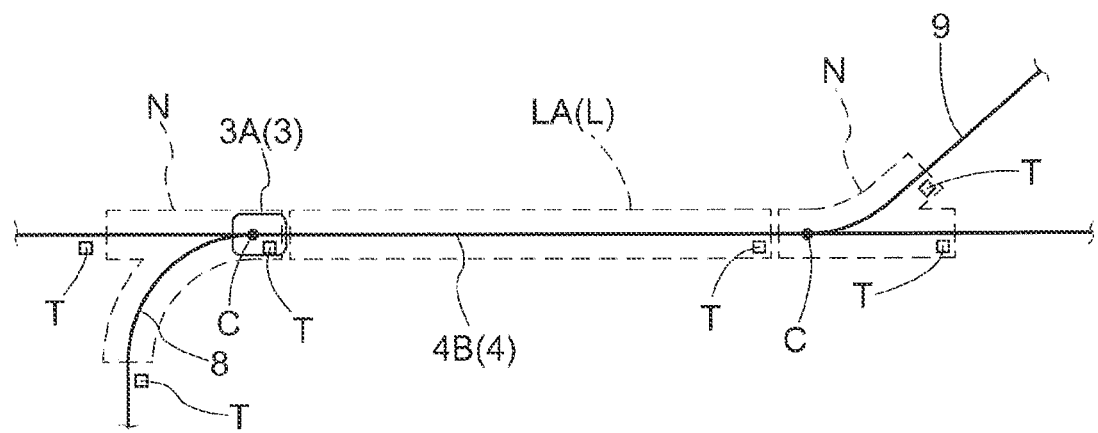
FIG. 9 is a diagram showing a state in which a target vehicle enters a target link in an empty traveling state.
Figure 10:
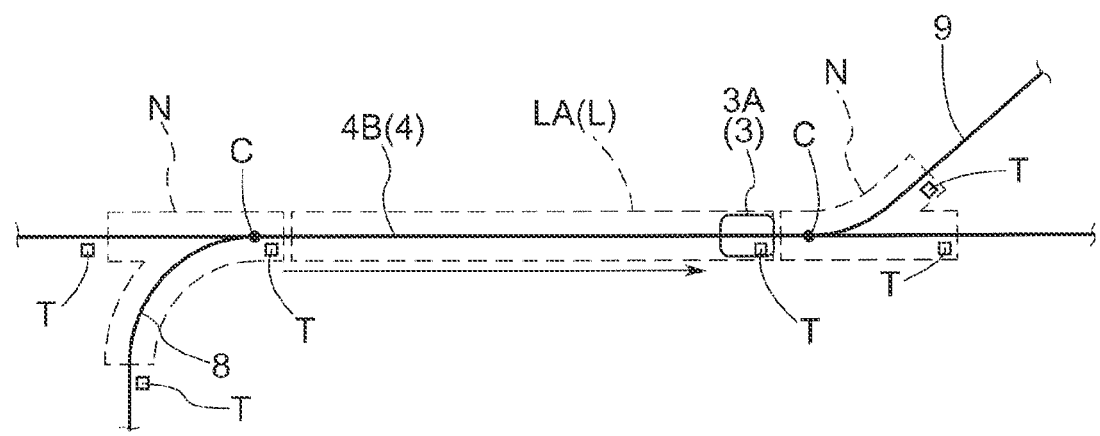
FIG. 10 is a diagram showing a state in which a target vehicle exits from a target link in an empty traveling state.

The reference cost ST for each link L is a value set based on a reference transit time, which is the time required for the target vehicle 3A to pass through the target link LA when another vehicle 3B is not present in the target link LA. In the present embodiment, as shown in FIG. 9, upon receiving position information S transmitted by a target vehicle 3A entering a target link LA in an empty traveling state in which no other vehicle 3B is present in the target link LA, the controller H calculates the reference transit time based on the time D of reception of position information S transmitted by the target vehicle 3A entering the target link LA and the time D of reception of position information S transmitted by the target vehicle 3A exiting the target link LA as shown in FIG. 10. The controller H sets the reference cost ST based on this reference transit time. For example, the reference cost ST can be the number of seconds making up the reference transit time.

Here, in order to improve the accuracy as an index of the reference cost ST, the controller H causes the target vehicle 3A to travel through the target link LA a plurality of times in a state where no other vehicle 3B is present in the target link LA, acquires the reference transit time for each of the times, and sets the reference cost ST based on the acquired reference transit times. In the present embodiment, the reference cost ST is the average value of the reference transit times of the trips, and the controller H sets the reference cost ST by dividing the total of the reference transit times by the number of trips. For example, if the reference cost ST is set based on two trips, and the reference transit time is 5 seconds and 8 seconds, then the total of 5 seconds and 8 seconds (13 seconds) is divided by the number of trips (2), thus obtaining the reference cost ST of 6.5. In the present embodiment, the target vehicle 3A is caused to travel the entire travelable route 1 a plurality of times before starting the operation of transporting articles W in the article transport facility, and the reference cost ST is set in advance for all of the links L that belong to the travelable route 1. In other words, before the controller H executes the route setting control #10 for the first time (here, before the operation of the article transport facility 100 starts), the reference cost ST is set for each of all of the links L that belong to the travelable route 1.

Also, the node cost is set for all of the nodes N that belong to the travelable route 1 before the route setting control #10 is executed (in the present embodiment, before the operation of the article transport facility 100 is started). This node cost is a cost set for each of the nodes N. In the present embodiment, the controller H performs control such that only one article transport vehicle 3 can enter a node N section, and thus the transit time for the article transport vehicle 3 to pass through a node N section is substantially fixed. In view of this, in this example, the node cost is set to a fixed value that does not have a variable component. Here, the node cost is set to a value that corresponds to the shape of the node N. Note that the present invention is not limited to this, and it is also favorable if, similarly to the reference cost ST described above, the node cost is a value set based on the reference transit time, which is the time required for the target vehicle 3A to pass the target node N while no other vehicle 3B is present. Alternatively, the node cost may be a uniform value for all nodes N regardless of their shape or the like.

As described above, due to the node cost being a fixed value, it is a value uniquely determined according to the number of nodes N in the candidate route 1B. In other words, it is not a value that changes according to the transport state of the article transport vehicle 3. Accordingly, the node cost may be added to the reference cost ST for the link L described above to obtain the reference cost ST.

The variable cost DY is a value that corresponds to the transit time (actual transit time) in an actual traveling state in which the target vehicle 3A travels through the target link LA while another vehicle 3B is present in the target link LA, and is a value that changes according to the number of other vehicles 3B. The larger the number of other vehicles 3B present in the target link LA is, the longer the actual transit time is. Here, this transit time, which increases each time the number of other vehicles 3B present in the target link LA increases, will be referred to as the "time increase per vehicle $\Delta Tn$". The variable cost DY is a value set based on the amount of time that the actual transit time, which is the time required for the target vehicle 3A to travel through the target link LA in the actual traveling state in which the target vehicle 3A travels through the target link LA while another vehicle 3B is present in the target link LA, increases relative to the reference transit time in accordance with the number of other vehicles 3B present in the target link LA (time increase per vehicle $\Delta Tn$ (amount of increase in actual transit time)). Due to being the amount of increase in the actual transit time that increases each time the number of other vehicles 3B increases, the time increase per vehicle $\Delta Tn$ corresponds to a "other vehicle cost".

Here, in order to improve the accuracy as an index of the variable cost DY, the controller H causes the target vehicle 3A to travel through the target link LA a plurality of times in a state where another vehicle 3B is present in the target link LA, acquires the actual transit time and the number of vehicles information indicating the number of other vehicles 3B present in the target link LA for each of the times, and obtains the time increase per vehicle $\Delta Tn$ based on the correlation between the number of vehicles information and the amount of increase in the actual transit time relative to the actual transit time. Specifically, the controller H sets, as the time increase per vehicle $\Delta Tn$, the amount of increase in the actual transit time per other vehicle, which is obtained by dividing the amount of increase in the actual transit time relative to the reference transit time by the number of vehicles indicated by the number of vehicles information. The average value of the time increase per vehicles $\Delta Tn$ obtained by causing the target vehicle 3A to travel through the target link LA a plurality of times is set as the final time increase per vehicle $\Delta Tn$.

Figure 11:
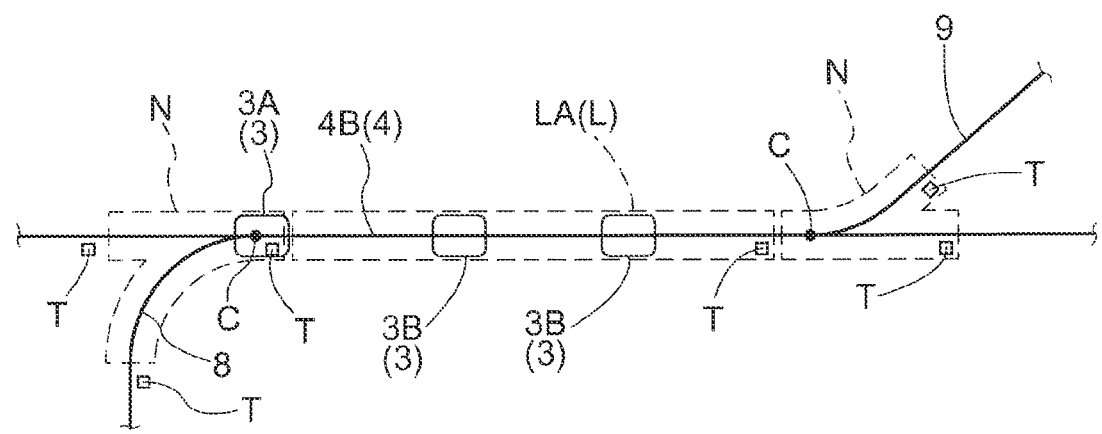
FIG. 11 is a diagram showing a state in which a target vehicle enters a target link in an actual running state.
Figure 12:
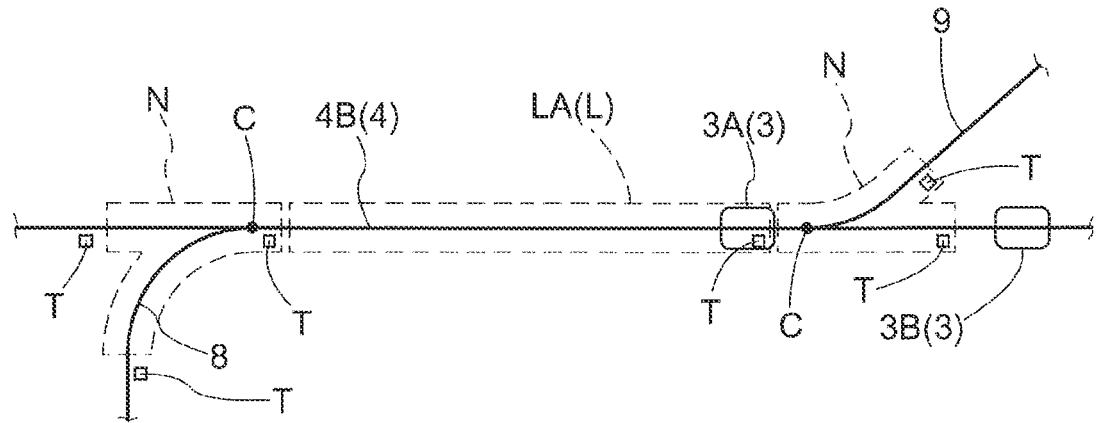
FIG. 12 is a diagram showing a state in which a target vehicle exits from a target link in an actual running state.

In the present embodiment, as shown in FIG. 11, upon receiving position information S transmitted by a target vehicle 3A entering a target link LA in an actual traveling state in which another vehicle 3B is present in the target link LA, the controller H calculates the actual transit time based on the time D of reception of position information S transmitted by the target vehicle 3A entering the target link LA and the time D of reception of position information S transmitted by the target vehicle 3A exiting the target link LA as shown in FIG. 12. The controller H obtains the time increase per vehicle $\Delta Tn$ (e.g., 5 seconds) by dividing the amount of increase (e.g., 10 seconds) in the actual transit time (e.g., 15 seconds) relative to the reference transit time (e.g., 5 seconds) by the number of vehicles (2 vehicles in FIG. 11) indicated by the number of vehicles information.

In the present embodiment, the calculation of the time increase per vehicle $\Delta Tn$ is performed both before the start of operation, which is before the start of transportation of the article W in the article transport facility 100, and after the start of operation. Specifically, the controller H first causes a plurality of article transport vehicles 3, which are the target vehicle 3A and the other vehicle 3B, to travel over the entire travelable route 1 before the start of operation in order to obtain the time increase per vehicle $\Delta Tn$ for all of the links L that belong to the travelable route 1. In other words, the controller H sets the initial time increase per vehicle $\Delta Tn$ for all of the links L that belong to the travelable route 1 before executing initial first route setting control (here, before the start of operation).

Further, even after the start of operation, which is after the start of transportation of the article W in the article transport facility, the controller H obtains the time increase per vehicle $\Delta Tn$ for the links L that belong to the travelable route 1 for the target vehicle 3A and the other vehicle 3B, which are the plurality of article transport vehicles 3 traveling on the travelable route 1, and accordingly updates the time increase per vehicles $\Delta Tn$ as necessary. At this time, the controller H obtains the time increase per vehicle $\Delta Tn$ each time the target vehicle 3A passes through the target link LA, and therefore updates the time increase per vehicle $\Delta Tn$ based on the obtained time increase per vehicle $\Delta Tn$ and time increase per vehicles $\Delta Tn$ obtained in the past. It is preferable that such updating of the time increase per vehicle $\Delta Tn$ is performed regularly during the operation of the article transport facility. It is also preferable that the variable cost DY used for the route setting control is set based on the most recent time increase per vehicle $\Delta Tn$.

However, in the present embodiment, when setting the time increase per vehicle $\Delta Tn$ (other vehicle cost), the controller H excludes the number of vehicles information and the actual transit time for when a problem occurred in the traveling of the target vehicle 3A, and the number of vehicles information and the actual transit time for when the target vehicle 3A passes through the target link LA while traveling is limited by the occurrence of a problem. If the passage of the target vehicle 3A through the target link LA is obstructed due to an abnormal stop of another vehicle 3B, an obstacle present during passage through the target link LA, or the like, or if an abnormality occurs in the target vehicle 3A and the target vehicle 3A stops or decelerates, the actual transit time for the target vehicle 3A to pass through the target link LA becomes significantly longer. In other words, if the number of vehicles information and the actual transit time obtained during such traveling are used for setting the time increase per vehicle ΔTn (other vehicle cost), the other vehicle cost is set to a value larger than what the value actually is. By excluding the number of vehicles information and the actual transit time obtained during such traveling when setting the other vehicle cost, it is possible to set a more appropriate other vehicle cost.

In the route setting control, the controller H determines the number of vehicles value n, which is the number of other vehicles 3B considered to be present in the target link LA, and sets the variable cost DY for the target link LA according to the number of vehicles value n. The controller H can set the variable cost DY to a value obtained by multiplying the number of vehicles value n for the target link LA by the time increase per vehicle ΔTn (amount of increase in actual transit time per other vehicle) for the target link LA obtained as described above. In other words, the variable cost DY can be set to the number of seconds obtained by multiplying the time increase per vehicle ΔTn by the number of vehicles value n, as shown in the following expression (2).

$$DY = \Delta Tn \cdot n \quad (2)$$

For example, if the number of vehicles value n of the target link LA is 4 and the time increase per vehicle ΔTn is 5 seconds, 20 is set as the variable cost DY. In this way, the variable cost DY is an index showing the amount of increase in the actual transit time of the target link LA, which is expected to increase as the number of other vehicles 3B considered to be present in the target link LA increases. When executing the route setting control, the controller H sets the variable cost DY for all of the links L belonging to the candidate route 1B that are candidates for the set route 1A from the current position of the setting vehicle 3C to the destination.

Based on the variable cost DY and the reference cost ST set in this way, the controller H determines the link cost LC for each of the links L in the candidate route 1B, which is a candidate for the set route 1A from the current position of the setting vehicle 3C to the destination. The route cost TC, which is the total cost of the candidate route 1B, is obtained based on the link costs LC, and the set route 1A is set based on the route costs TC of the candidate route 1B.

The following describes a method for determining the number of vehicles value n. When the controller H determines the number of vehicles value n, other vehicles 3B determined to actually be present in the target link LA are deemed to be other vehicles that are present in the target link LA. The number of such other vehicles 3B is the current number of vehicles value na. Also, in the present embodiment, when the controller H determines the number of vehicles value n, another vehicle 3B for which the set route 1A passing through the target link LA has already been set is deemed to be another vehicle present in the target link LA regardless of the current position of the other vehicle 3B. Note that another vehicle 3B for which the set route 1A passing through the target link LA has already been set may also be another vehicle 3B for which the set route 1A having the target link LA as the destination has already been set. This number of other vehicles 3B is a future number of vehicles value nb. In other words, the number of vehicles value n is the sum of the current number of vehicles value na and the future number of vehicles value nb as shown in the following expression (3).

$$n = na + nb \quad (3)$$

Figure 13:
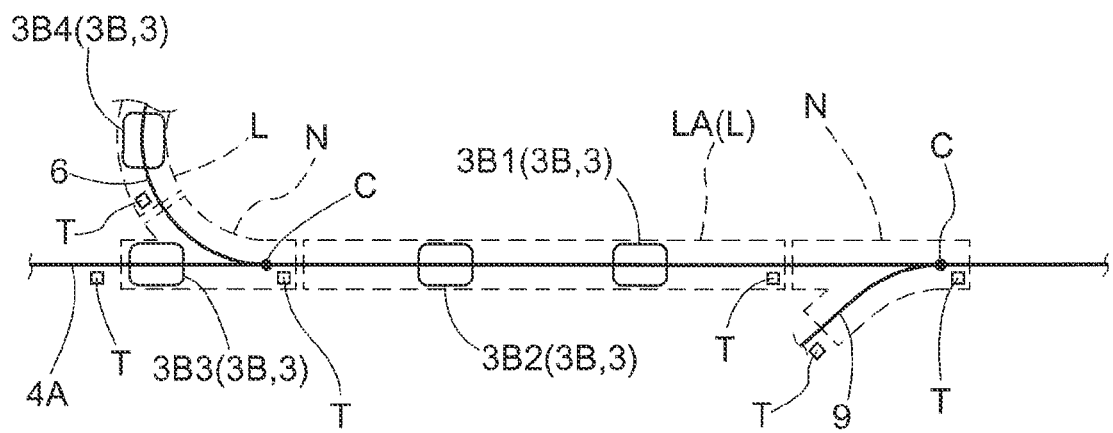
FIG. 13 is a diagram showing other vehicles considered to be present in the target link.

In other words, in the present embodiment, when the controller H determines the number of vehicles value n (4 in the example in FIG. 13), the other vehicles deemed to be present in the target link LA are the other vehicles 3B determined to be present in the target link LA when executing the route setting control #10 for the setting vehicle 3C (2 vehicles in the example shown in FIG. 13), as well as the other vehicles 3B that were determined to not be present in the target link LA when executing the route setting control #10 but are other vehicles 3B for which the target link LA has already been entirely or partially set as the set route 1A (two vehicles in the example shown in FIG. 13). In this way, the links L that belong to the candidate routes 1B are used as the target links LA, and the controller H determines the number of vehicles value n for each of target links LA.

By determining the number of vehicles value n in this way, the link cost LC of the target link LA can be determined based on not only the actual congestion level of the target link LA when route setting control is performed for the setting vehicle 3C (in the example shown in FIG. 13, there are two other vehicles 3B), but also the future congestion level of the target link LA. Specifically, even if another vehicle 3B is not present in the target link LA at the time of route setting control, if it is scheduled to pass through the target link LA, that other vehicle 3B can possibly be present in the target link LA before or after the setting vehicle 3C passes through the target link LA, and thus may increase the congestion level of the target link LA. Also, if there are many other vehicles 3B that are not present in the target link LA before or after the setting vehicle 3C passes through the target link LA but are scheduled to pass through the target link LA, the future congestion level of the target link LA is likely to be high. According to the configuration of the present embodiment, the link cost LC of the target link LA can be determined based on the future congestion level of the target link LA as well, and thus the set route 1A of the setting vehicle 3C is more likely to be set appropriately.

The controller H determines the link cost LC for each of the target links LA that make up the candidate route 1B. As shown in the following expression (4), the link cost LC is determined based on the reference cost ST and the variable cost DY that corresponds to the number of vehicles value n.

$$LC = ST + DY = ST + (\Delta Tn \cdot n) = ST + (\Delta Tn \cdot (na + nb)) \quad (4)$$

The reference cost ST is a value set based on the reference transit time, and is the number of seconds in the reference transit time in the present embodiment. Accordingly, for example, if the reference transit time is 10 seconds, the reference cost ST is set to "10". Also, the variable cost DY is a value set based on the time increase per vehicle ΔTn of vehicles, and in the present embodiment, is the number of seconds set based on the value obtained by multiplying the number of vehicles value n by the time increase per vehicle ΔTn, which indicates the time increase per other vehicle. Therefore, for example, if the number of vehicles value n is 4 and the time increase per vehicle ΔTn is 5 seconds, the variable cost DY is set to "20". If the reference cost ST and the variable cost DY are set as in these examples, the link cost LC of the target link LA is the sum of the reference cost ST "10" and the variable cost DY "20", or in other words is "30". The controller H determines the link cost LC for each of the target links LA that make up the candidate route 1B.

Note that because the number of vehicles value n includes the current number of vehicles value na and the future number of vehicles value nb, the variable cost DY can also be expressed by expanding the second term on the right side of expression (4) as shown in the following expression (5). In order to distinguish between the variable cost DY that is based on the current number of vehicles value na (the first term on the right side) and the variable cost DY that is based on the future number of vehicles value nb (the second term on the right side), the former will be called the first variable cost DYa and the latter will be called the second variable cost DYb. In this case, the link cost LC shown in expression (4) is expressed by the following expression (6).

$$DY = \Delta Tn \cdot na + \Delta Tn \cdot nb = DYa + DYb \tag{5}$$

$$LC = ST + DY = ST + DYa + DYb \tag{6}$$

Note that it is preferable that the controller H sets, as the target other vehicle 3D, another vehicle 3B that will travel at the same time as the setting vehicle 3C at a position in front of the setting vehicle 3C, based on an arrival time of the setting vehicle 3C at a target link LA estimated based on the route from the position of the setting vehicle 3C at the setting time to the target link LA, and arrival times of other vehicles 3B at the target link LA estimated based on the route from the positions of the other vehicles 3B at the setting time to the target link LA. Another vehicle 3B that will travel at the same time as the setting vehicle 3C at a position in front of the setting vehicle 3C has a large influence on the traveling of the setting vehicle 3C. By setting the target vehicle 3A based on the positional relationship between the setting vehicle 3C and other vehicles 3B in the target link LA, it is possible to set the set route 1A more appropriately.

However, if the positional relationship between the setting vehicle 3C and other vehicles 3B in a target link LA is calculated for all of the target links LA and all of the other vehicles 3B (other vehicles 3B that can possibly be the target vehicle 3A), it is possible for the calculation load to become very large. Accordingly, the target vehicle 3A may be set regardless of the positional relationship between the setting vehicle 3C and other vehicles 3B in the target link LA.

Note that the article transport vehicles 3 do not all have the same traveling purpose. For example, as described above with reference to FIG. 6, in the first travel control #2, an article transport vehicle 3 is caused to travel to a position corresponding to a transport-source transfer target location 15, and in the second travel control #5, an article transport vehicle 3 is caused to travel to a position corresponding to a transport-destination transfer target location 15. In other words, the traveling purpose of the set route 1A that is set in the first route setting control #1 is different from the traveling purpose of the set route 1A that is set in the second route setting control #4.

Also, as described above, the article transport facility 100 includes a plurality of article processing apparatuses P and a plurality of storage units R. The article transport facility 100 of the present embodiment is a semiconductor manufacturing facility, for example, and the article processing apparatuses P are each a production device that performs various types of manufacturing processes on a semiconductor substrate, and is a place where transport target articles W are used. Also, the storage units R are each a storage unit for a semiconductor substrate serving as a material, or a storage unit for a semiconductor in the process of being manufactured (a semiconductor substrate subjected to processing in some steps), and is a storage location for transport target articles W. Therefore, the transport source can be an article processing apparatus P or a storage unit R, and the transport destination can also be an article processing apparatus P or a storage unit R.

In the article transport facility 100 that is a semiconductor manufacturing facility, the article W transport efficiency affects the semiconductor device production efficiency. Specifically, in order to improve the semiconductor device production efficiency, it is preferable to improve the article W transport efficiency. In other words, it is not preferable that articles W remain in article processing apparatuses P for a long time from the viewpoint of the operating rate of the article processing apparatuses P, but rather it is preferable that articles W are quickly transported to article processing apparatuses P, and that articles W are quickly retrieved from article processing apparatuses P. Accordingly, for example, it is preferable that an article processing apparatus P is set as the transport source with priority over a storage unit R being set as the transport source, and it is preferable that an article processing apparatus P is set as the transport destination with priority over a storage unit R being set as the transport destination.

Therefore, in the present embodiment, in the case of the same target link LA, a higher link cost LC is set for a setting vehicle 3C having a low-priority traveling purpose than a setting vehicle 3C having a high-priority traveling purpose, thus making it less likely for a route that includes the target link LA to be set as the set route 1A for the setting vehicle 3C having a low-priority traveling purpose. In other words, the controller H sets a priority adjustment value Y, which is a value set according to the traveling purpose of the article transport vehicle 3, and sets the priority adjustment value Y so as to increase continuously or stepwise as the priority for arriving more quickly at the destination decreases. In the route setting control #10 described above, the controller H adjusts the variable cost DY based on the priority adjustment value Y that is in accordance with the traveling purpose of the setting vehicle 3C, and calculates an adjusted variable cost DYc. Based on the above expression (1), the link cost LC is calculated using the following expression (7).

$$LC = ST + DY \cdot Z = ST + DYy \tag{7}$$

At a setting time, which is the time when the route setting control #10 is executed, based on the adjusted variable cost DYc and the reference cost ST, the controller H determines the link cost LC for each link L in the candidate route 1B from the position of the setting vehicle 3C at the setting time to the destination. The controller H then obtains the route cost TC, which is the cost of the candidate route 1B, based on the link costs LC, and sets the set route 1A based on the route costs TC of the candidate routes 1B.

Note that the traveling purpose is not limited to being the transport of an article W as described above, and may also be "retreat traveling" in which an article transporting vehicle 3 that is not transporting an article W moves out of the way so as to not interfere with the traveling of other article transporting vehicles 3. In other words, the retreat traveling involves traveling to a destination set so as to clear the route for another article transport vehicle 3. From the viewpoint of another article transport vehicle 3 that is transporting an article W, this corresponds to evicting the article transport vehicle 3 that is not transporting an article W, and is also sometimes referred to as "eviction traveling". Of course, the traveling purpose of this retreat traveling has a lower priority than traveling for transporting an article W. Here, this traveling for transporting an article W will be referred to as "transport-related traveling" for traveling to a destination set for receiving an article W or delivering an article W. The priority adjustment value Y for retreat traveling is set higher than the priority adjustment value Y for transport-related traveling.

Also, as previously mentioned, it is preferable that an article processing apparatus P is set as the transport source with priority over a storage unit R being set as the transport source, and it is preferable that an article processing apparatus P is set as the transport destination with priority over a storage unit R being set as the transport destination. Here, traveling to a destination that is an article W usage location (e.g., an article processing apparatus P) will be referred to as "first transport-related traveling", and traveling to a destination that is an article W storage location (e.g., a storage unit R) will be referred to as "second transport-related traveling". In the present embodiment, in the case where the traveling purposes include the first transport-related traveling and the second transport-related traveling, the priority adjustment value Y for the second transport-related traveling is set higher than the priority adjustment value for the first transport-related traveling.

Also, the traveling purposes also include traveling for delivering an article W (delivery traveling) and traveling for receiving an article W (receiving traveling). Delivery traveling and receiving traveling can both be performed for one destination. In other words, delivery traveling and receiving traveling can be performed in first transport-related traveling to a destination that is a usage location, and delivery traveling and receiving traveling can be performed in second transport-related traveling to a destination that is a storage location. Specifically, the traveling purpose include "first delivery traveling" for traveling to a destination that is an article W usage location in order to deliver an article W, "first receiving traveling" for traveling to a destination that is an article W usage location in order to receive an article W, "second delivery traveling" for traveling to a destination that is an article W storage location in order to deliver an article W, and "second receiving traveling" for traveling to a destination that is an article W storage location in order to receive an article W. Also, the traveling purposes also include "retreat traveling" for traveling to a destination set so as to clear the route for another article transport vehicle 3.

Among these five traveling purposes, the priority adjustment value Y is set the lowest for "first delivery traveling" and set the highest for "retreat traveling". Specifically, the priority adjustment value Y increases in the order of "first delivery traveling", "first receiving traveling", "second delivery traveling", "second receiving traveling", and "retreat traveling". In other words, the priority adjustment value Y is set so as to increase downward in Table 1 below. For example, if the priority adjustment value Y of "first delivery traveling" with the smallest value is "1", the value in "first receiving traveling" can be set to "1.5", the value in "second delivery traveling" can be set to "2", the value in "second receiving traveling" can be set to "2.5", and the value in "retreat traveling" can be set to "3~4".

TABLE 1

| | Traveling purpose | | Y |
|---|---|---|---|
| Transport-related traveling | First transport traveling | First delivery traveling | Low |
| | | First receiving traveling | ↓ |
| | Second transport traveling | Second delivery traveling | |
| | | Second receiving traveling | |
| | Retreat traveling (eviction traveling) | | High |

In the above illustrated example, the priority adjustment value Y increases in the order of "first delivery traveling", "first receiving traveling", "second delivery traveling", "second receiving traveling", and "retreat traveling", but the priority adjustment value Y may be the same for "first delivery traveling" and "first receiving traveling" as shown in Table 1, for example. Similarly, the priority adjustment value Y may be the same value for "second delivery traveling" and "second receiving traveling". Also, although examples for this will not be given, a configuration is possible in which the priority adjustment value Y has a larger value for "first receiving traveling" than for "first delivery traveling", has a larger value for "second receiving traveling" than for "second delivery traveling", and has the same value for "first receiving traveling" and "second delivery traveling". In other words, in the order of "first delivery traveling", "first receiving traveling", "second delivery traveling", and "second receiving traveling", the priority adjustment value Y may be set higher than or equal to the value of the previous traveling purpose. Note that in this case as well, the priority adjustment value Y is set higher in retreat traveling than in transport-related traveling (first delivery traveling, first receiving traveling, second delivery traveling, second receiving traveling).

The priority adjustment value Y may be set as stepwise values such as "1", "1.5", "2", "2.5", and "4" as illustrated above, or may be set as continuous values through multiplication by a coefficient that corresponds to the article processing apparatus P or the storage unit R that is the destination. For example, if the article processing apparatus P that is the destination has been assigned a priority that is based on a manufacturing step or the like, the priority adjustment value Y may be set to a value obtained by multiplying the priority adjustment value Y in the above examples by a priority level that is based on the manufacturing step. Specifically, in the case where a first article processing apparatus P and a second article processing apparatus P are destinations in first receiving traveling, the first article processing apparatus P has a priority level of "0.8", and the second article processing apparatus P has a priority level of "1.1", then the priority adjustment value Y may be set to "0.8" when the first article processing apparatus P is the destination, and the priority adjustment value Y may be set to "1.1" when the second article processing apparatus P is the destination.

As described above, in the present embodiment in which the variable cost DY is adjusted by the priority adjustment value Y before calculating the link cost LC, the controller H sets the target other vehicle 3D to another vehicle 3B that has already been assigned a set route 1A that passes through the target link. Given that one set route 1A is set for one article transport vehicle 3, a link L that is included in the set route 1A of the other vehicle 3B and also included in the candidate route 1B of the setting vehicle 3C can be set as the target link LA through relatively simple processing.

Note that depending on the usage status of the travelable route 1, there are cases where the set route 1A that is set for each article transport vehicle 3 is changed while the article transport vehicle 3 is traveling along the set route 1A. Accordingly, it is possible for a link L not included in the set route 1A of the other vehicle 3B to be set as the target link LA. For example, the target link LA may be set to a link L that is included in the top three routes having the shortest distances among the candidate routes 1B of the other vehicle 3B and is also included in the candidate route 1B of the setting vehicle 3C.

Also, in the present embodiment, the controller H further corrects the variable cost DY (adjusted variable cost DYc) with use of the density value d. The controller H corrects the link cost LC in the route setting control #10 such that the link cost LC increases as the density value d increases. Here, the density value d is a value obtained by dividing the number of vehicles value n by the maximum value Z of the number of article transport vehicles 3 that can be present in the target link LA, as shown in the following expression (8). The link cost LC is corrected by correcting the variable cost DY (adjusted variable cost DYc) with use of the density value d as shown in the following expression (9).

$$d = n/Z \quad (8)$$

$$LC = ST + d \cdot DY \quad (9)$$

For example, if the maximum value of the number of article transport vehicles 3 that can be present in the target link LA is 5, and the number of vehicles value n determined as described above is 6, the density value d is 1.2. As another example, if the maximum value of the number of article transport vehicles 3 that can be present in the target link LA is 5, and the number of vehicles value n determined as described above is 4, the density value d is 0.8.

For example, if the reference cost ST is "10", the variable cost DY (adjusted variable cost DYc) is "20", and the density value d is "1.2", then the controller H sets link cost LC to "34", which is the sum of the reference cost ST and "24", which is a corrected value obtained by multiplying the variable cost DY by the density value d, as shown in expression (9). Note that if the density value d is not taken into consideration, the link cost LC is "30", which is the sum of "10" and "20". In other words, the controller H uses the density value d to correct the link cost LC such that the link cost LC increases as the density value d increases in the route setting control. The controller H corrects the link cost LC with use of the density value d for each of the target links LA that make up the candidate route 1B.

By correcting the link cost LC in this way, the congestion level of the target link LA, which depends on the maximum value of the number of article transport vehicles 3 that can be present in the target link LA (route length of the target link LA), can be reflected in the link cost LC. Then, by correcting the link cost LC so as to increase as the density value d increases, a candidate route 1B that includes a link L having a high density value d is not likely to be set as the set route 1A. Accordingly, it is possible to easily average the densities of article transport vehicles 3 present in the links L, and it is possible to reduce the possibility of frequent occurrence of traffic congestion in a specific link L.

The priority adjustment value Y can be taken into consideration for the density value d as well. The controller H obtains an adjusted density value dc by adjusting the density value d with use of the priority adjustment value Y that corresponds to the traveling purpose of the setting vehicle 3C (see the following expression (10)).

$$dc = Y \cdot (n/Z) \quad (10)$$

When the expression (10) is expanded, the numerator corresponds to an adjusted number of vehicles value obtained by adjusting the number of vehicles value n according to the priority adjustment value Y. Specifically, the adjusted density value dc is a value obtained by dividing the adjusted number of vehicles value by the maximum value Z of the number of article transport vehicles 3 that can be present in the target link LA. In other words, the link cost LC in the target link LA is adjusted by adjusting the number of article transport vehicles 3 (other vehicles 3B) considered to be present in the target link LA.

Figure 14:
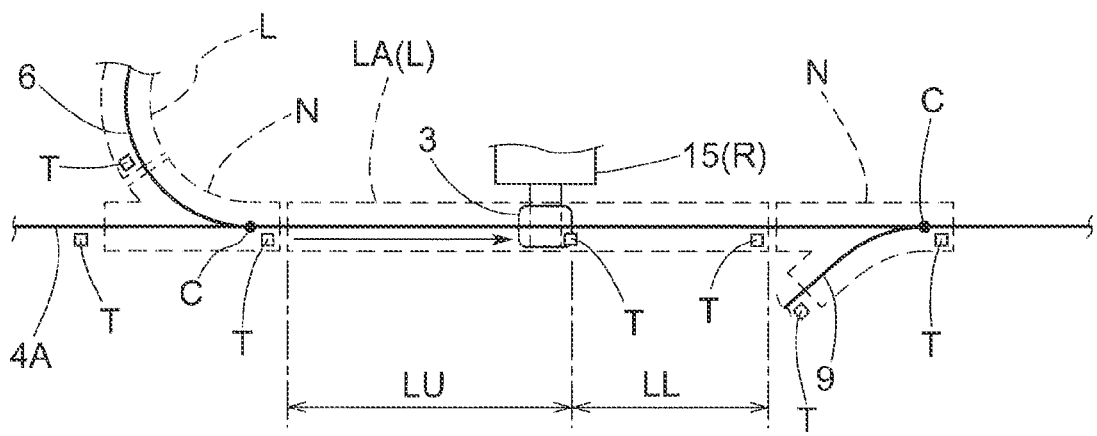
FIG. 14 is a diagram showing an upstream portion and a downstream portion of a target link.

Also, in the present embodiment, correction is performed on the link cost LC of the link L at the current position and the link L at the destination among the links L that belong to the candidate route 1B. As shown in FIG. 14, in the case of the link L at the current position, the reference transit time and the actual transit time are corrected based on the percentage of the region downstream of the destination in the link L (downstream region LL). Specifically, if the reference transit time is 5 seconds, the actual transit time is 20 seconds, and the percentage of the downstream region LL is 40%, then the reference transit time is corrected to 2 seconds, the actual transit time is corrected to 8 seconds, only the other vehicles 3B deemed to be present downstream of the current position in the target link LA are deemed to be other article transport vehicles 3 present in the target link LA when adjusting the current number of vehicles value na and correcting the number of vehicles value n. Also, in the case of the link L of the destination, the reference transit time and the actual transit time are corrected based on the percentage of the region upstream of the destination in the link L (upstream region LU). Specifically, if the reference transit time is 5 seconds, the actual transit time is 20 seconds, and the percentage of the upstream region LU is 60%, then the reference transit time is corrected to 3 seconds, the actual transit time is corrected to 12 seconds, only the other vehicles 3B deemed to be present upstream of the current position in the target link LA are deemed to be other article transport vehicles 3 present in the target link LA when adjusting the current number of vehicles value na and correcting the number of vehicles value n. In this way, in the case of the link L at the current position and the link L at the destination, the corrected reference transit time (reference cost ST), actual transit time, and number of vehicles value n are corrected when correcting the link cost LC.

Specifically, the controller H corrects the reference transit time and the actual transit time in the link L at the current position and the link L at the destination by a traveling region coefficient k for which the setting vehicle 3C travels in the links L at the start point and the end point in the candidate route 1B. As shown in the example shown in FIG. 14, if the percentage of the downstream region LL is 40% in the link L at the current position, "k=0.4" is set, and if the percentage of the upstream region LU is 60% in the link L at the destination, "k=0.6" is set. In other links L, "k=1". Accordingly, this can be expressed as the following expression (11). Of course, the variable cost DY in expression (11) may be the adjusted variable cost DYc obtained by adjustment using the priority adjustment value Y, and furthermore may be adjusted using the density value d (or the adjusted density value dc).

$$LC = k(ST + DY) \quad (11)$$

Figure 15:
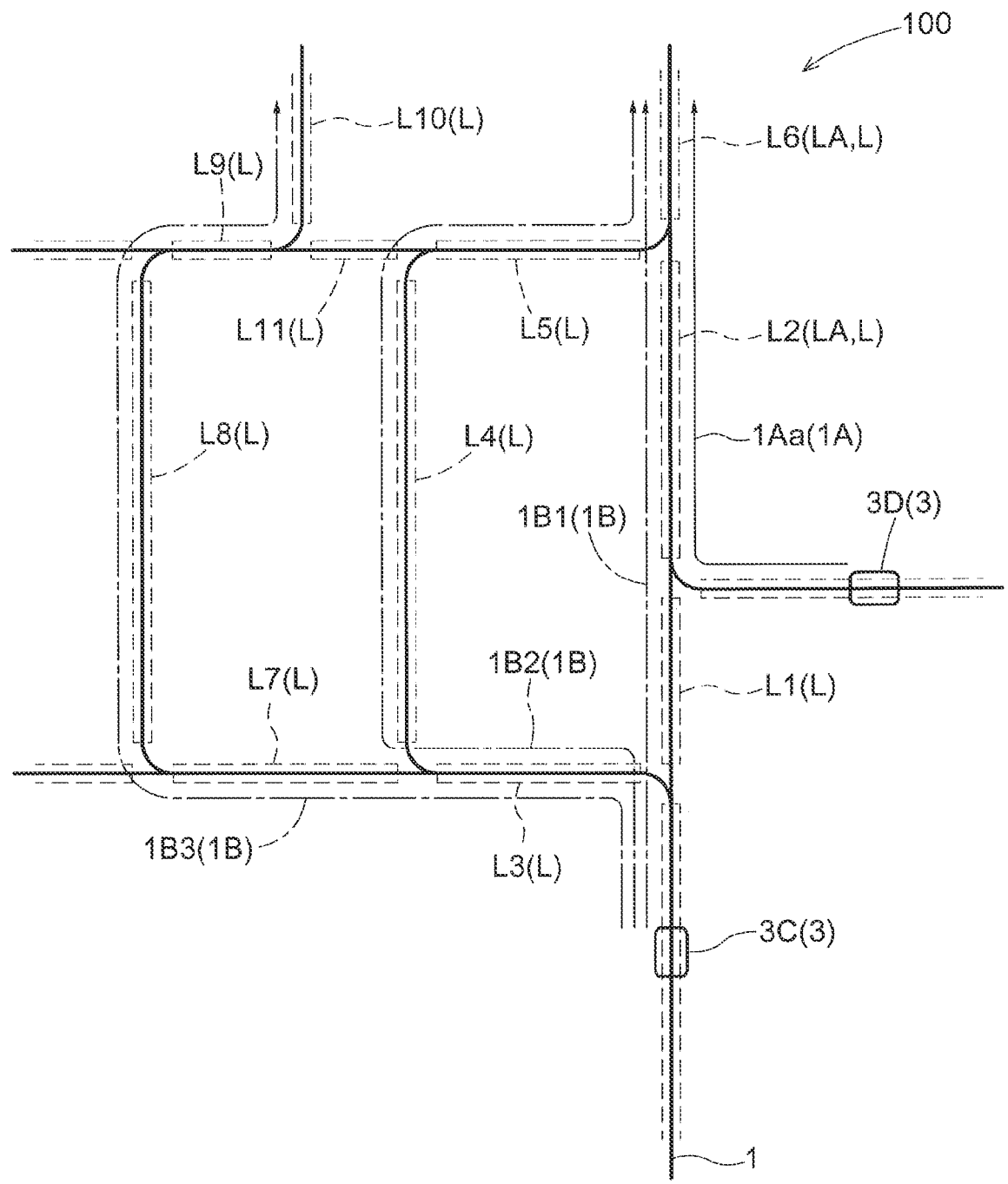
FIG. 15 is a diagram showing an example of the relationship between candidate routes and the set route of a target other vehicle.

The following describes a specific example. FIG. 15 shows an example of the relationship between a plurality of candidate routes 1B of the setting vehicle 3C and the set route 1A of the target other vehicle 3D (target other vehicle route 1Aa). Among the candidate routes 1B, a first candidate route 1B1 is a route that passes through a first link L1 and a second link L2. A second candidate route 1B2 is a route that passes through a third link L3, a fourth link L4, and a fifth link L5. Also, the first candidate route 1B1 and the second candidate route 1B2 are both routes that pass through a sixth link L6. The third candidate route 1B3 is a route that passes through the third link L3, a seventh link L7, an eighth link L8, a ninth link L9, and a tenth link L10. Here, the second link L2 and the sixth link L6 are links L included in the target other vehicle route 1Aa, which is the set route 1A of the target other vehicle 3D, and correspond to the target link LA in the route setting control #10 for the setting vehicle 3C. Also, the traveling purpose of the target other vehicle 3D is the above-described first delivery traveling, which is the traveling purpose that has the highest priority. On the other hand, the traveling purpose of the setting vehicle 3C is retreat traveling, which is the traveling purpose that has the lowest priority.

When calculating the link cost LC of the second link L2 serving as the target link LA in the first candidate route 1B1, the controller H sets "4", for example, as the priority adjustment value Y for retreat traveling, and adjusts the variable cost DY of the second link L2. Also, the sixth link L6, which is the link L after the second link L2 in the first candidate route 1B1, is also the target link LA, and when calculating the link cost LC of the sixth link L6 as well, the controller H sets "4" as the priority adjustment value Y, and adjusts the variable cost DY of the sixth link L6. As a result, if the route cost TC of the first candidate route 1B1 increases, and the route cost TC becomes higher than that of the second candidate route 1B2, which is a detour route with respect to the first candidate route 1B1, the controller H is more likely to set the second candidate route 1B2 as the set route 1A of the setting vehicle 3C.

Note that the second candidate route 1B2 also includes the sixth link L6, which is a target link LA. However, the third candidate route 1B3, which is more of a detour route than the second candidate route 1B2, does not include a target link LA, and the link cost LC does not increase due to the priority adjustment value Y. For this reason, the route cost TC of the third candidate route 1B3 is smaller than that of the second candidate route 1B2 in some cases, and in such a case, the third candidate route 1B3 is set as the set route 1A of the setting vehicle 3C. In this way, adjusting the variable cost DY according to the priority adjustment value Y suppresses the number of article transport vehicles 3 traveling on a route (link L) passed through by the target other vehicle 3D having a high-priority traveling purpose, thus making it possible to reduce the likelihood that the traveling of the target other vehicle 3D will be hindered.

As described above, the controller H repeatedly executes the route setting control #10 at least at a regular time interval. For this reason, even if, for example, the link cost LC of the sixth link L6 serving as the target link LA increases due to the priority adjustment value Y, and the third candidate route 1B3 has been set as the set route 1A, there are cases where the target other vehicle 3D passes through the sixth link L6, and the sixth link L6 is no longer a target link LA. At this time, if the setting vehicle 3C is traveling through the eighth link L8 or the ninth link L9, it is also possible to select a route that passes through the eleventh link L11 and the fifth link L5 instead of the tenth link L10, and then passes through the sixth link L6. Then, if the link cost LC of the sixth link L6 decreases due to no longer being the target link LA, a route that passes through the eleventh link L11 and then the sixth link L6 may be set as the set route 1A, instead of the third candidate route 1B3.

As described above, the article transport facility 100 is provided with the power supply lines 20, which are for supplying power to the article transport vehicles 3, along the travelable route 1, and the travelable route 1 is divided into a plurality of power supply areas E. An area maximum number of vehicles is set for each power supply area E, and the number of article transport vehicles 3 to which power can be supplied in each power supply area E is less than or equal to the area maximum number of vehicles. The controller H can perform weighting as follows when calculating the link cost LC of links L that belong to different power supply areas E.

Here, one of the power supply areas E is set as the target power supply area. If the number of other vehicles 3B deemed to be present in the target power supply area is greater than or equal to the area maximum number of vehicles of the target power supply area, the controller H executes power supply area correction processing. Specifically, in the route setting control #10, the controller H executes power supply area correction processing for correcting the link cost LC of a link L included in the target power supply area so as to be higher than the link cost LC of a link L not included in the target power supply area. For example, letting "Ek" be the area correction coefficient, the link cost LC is corrected as shown in the following expression (12).

$$LC = Ek(ST + DY) \tag{12}$$

Although omitted for the sake of simplicity, the right-hand side in the expression (12) may be a value that has been adjusted using the density value d, the traveling region coefficient k, or the like. In this way, although a mode has been described in which in the expression (12), the total link cost LC (reference cost ST and variable cost DY) is adjusted using the area correction coefficient Ek, the variable cost DY may be adjusted using the area correction coefficient Ek as shown in the following expression (13), similarly to the priority adjustment value Y and the density value d. Of course, this case can also be used in combination with other adjustment performed using the density value d, the traveling region coefficient k, or the like.

$$LC = ST + Ek \cdot DY \tag{13}$$

Based on the link cost LC determined as described above, the controller H determines the route cost TC of each candidate route 1B. The route cost TC is a cost representing an estimated value of the time required for the setting vehicle 3C to travel on the candidate route 1B. In the present embodiment, the controller H determines the route cost TC for the candidate route 1B by adding the link costs LC for each of all of the links L that belong to the candidate route 1B and the node cost for each of all of the nodes N that belong to the candidate route 1B. The controller H then compares the route costs TC determined for the candidate routes 1B, and sets the candidate route 1B having the lowest route cost TC among the candidate routes 1B as the set route 1A. As a result, it is possible to appropriately consider the influence of other vehicles 3B present in the travelable route 1 and increase the likelihood that the route with the shortest time to reach the destination can be set as the set route 1A in the actual traveling situation.

Hereinafter, other embodiments will be described. It should be noted that the configurations of the embodiments described below are not limited to being applied independently, and can be applied in combination with the configurations of other embodiments as long as no contradiction arises.

(1) In the above description, an example is described in which the reference cost ST is set based on the transit time when the target vehicle 3A actually travels on the target link LA in a state where the other vehicles 3B are not present in the target link LA. However, the present invention is not limited to such a configuration. For example, a configuration is possible in which the reference cost ST is set based on the route length and the shape of the target link LA without actually causing the target vehicle 3A to travel. Specifically, a configuration is possible in which an ideal traveling speed for the article transport vehicle 3 is obtained for each of various positions based on the shape of the target link LA, the reference transit time of the target link LA for the article transport vehicle 3 is obtained based on the traveling speeds at the positions and the route length of the target link LA, and the reference cost ST is set based on the reference transit time.

(2) In the above description, an example is described in which the reference cost ST is set for each of all of the links L that belong to the travelable route 1 before the controller H executes route setting control the first time. However, the present invention is not limited to such a configuration. For example, a configuration is also favorable in which, even after transport of the article W is started in the article transport facility (after the operation is started), when the article transport vehicle 3 travels through the target link LA in a state where other vehicles 3B are not present, the transit time of the target link LA during such traveling is acquired as the reference transit time, and the reference cost ST is updated as necessary.

(3) In the above description, an example is described in which, when another vehicle 3B is present in the target link LA, the amount of increase in the actual transit time per other vehicle 3B, which is obtained by dividing the amount of increase in the actual transit time relative to the reference transit time by the number of vehicles indicated in the number of vehicles information, is used as the time increase per vehicle ΔTn. However, the present invention is not limited to such a configuration. For example, a configuration is possible in which the time increase per vehicle ΔTn is also calculated in a similar manner when no other vehicle 3B is present in the target link LA, and if the number of vehicles indicated by the number of vehicles information is 1 or more, the time increase per vehicle ΔTn is obtained by dividing the amount of increase by the number of vehicles indicated by the number of vehicles information, whereas if the number of vehicles indicated by the number of vehicles information is 0, the number of vehicles indicated by the number of vehicles information is set to 1 in order to avoid a denominator of 0 when obtaining the time increase per vehicle ΔTn. Alternatively, a configuration is possible in which a value obtained by adding 1 to the number of vehicles indicated in the number of vehicles information is always used, and the time increase per vehicle ΔTn is obtained by dividing the amount of increase amount by the resulting number of vehicles.

(4) In the above description, an example is described in which the time increase per vehicle ΔTn is the amount of increase in the actual transit time per other vehicle 3B relative to the reference transit time. However, the present invention is not limited to such a configuration. For example, a configuration is also favorable in which the time increase per vehicle ΔTn is expressed as a correlation map or a correlation expression for the amount of increase in the actual transit time relative to the reference transit time and the number of vehicles information. As a specific example, the time increase per vehicle ΔTn can also be a correlation map in which the horizontal axis indicates the number of other vehicles 3B, the vertical axis indicates the amount of increase in the actual transit time relative to the reference transit time, and the correlation relationship between them is expressed using a linear or non-linear graph or numerical table, or a correlation expression that indicates the relationship using an expression. In the case of such a configuration, the time increase per vehicle ΔTn can be set so as to express a non-linear correlation in which the rate of increase in the actual transit time gradually increases as the number of vehicles increases, such as being 3 seconds if the number of vehicles indicated by the number of vehicles information is 1, being 8 seconds if the number of vehicles is 2, and being 15 seconds if the number of vehicles is 3.

(5) In the above description, an example is described in which the link cost LC is corrected using the density value d. However, the present invention is not limited to such a configuration. For example, a configuration is possible in which the link cost LC is not corrected using the density value d. Also, the link cost LC may be corrected using a value representing the route length of the target link LA, for example. In this case, the link cost LC may be corrected such that the link cost LC decreases as the route length of the target link LA increases, for example. Alternatively, the link cost LC may be corrected using an index value other than those described above.

(6) In the above description, an example is described in which the density value d is multiplied by the variable cost DY as shown in expression (9). However, as the density value d increases, the variable cost DY becomes sufficiently larger than the reference cost ST, and thus the influence of the reference cost ST on the link cost LC becomes relatively small. Accordingly, the controller H may add the variable cost (e.g., 20) to the reference cost (e.g., 10), multiply the resulting value by the density value (e.g., 1.2) to obtain a corrected value (e.g., 36), and use the corrected value as the link cost LC. In other words, "LC=d (ST+DY)" may be used instead of expression (9).

(7) In the above description, an example is described in which, when determining the route cost TC of the candidate route 1B, the node costs of the nodes N that belong to the candidate route 1B are added to the link costs LC of the links L that belong to the candidate route 1B. However, the present invention is not limited to such a configuration. For example, a configuration is possible in which the node cost is not taken into consideration when determining the route cost TC of the candidate route 1B. In this case, a configuration is also favorable in which only nodes N that do not have a route length are the connection points C, and the link L is the entirety of a route portion connecting a pair of adjacent connection points C.

(8) In the above description, an example is described in which the controller H determines the route cost TC of the candidate route 1B with use of the link costs LC of all of the links L that belong to the candidate route 1B. However, the present invention is not limited to such a configuration. For example, a configuration is possible in which the route cost TC is obtained based on the link costs LC of a portion of the links L that belong to the candidate route 1B, such as in the case where the route cost TC does not include the link costs LC of the link L that includes the current position of the setting vehicle 3C and the link cost LC of the link L that includes the destination.

(9) In the above description, an example is described in which the link cost LC is determined for each of all of the links L that belong to the candidate route 1B. However, the present invention is not limited to such a configuration. For example, a configuration is possible in which the controller H determines the link cost LC of each link L that belongs to the candidate route 1B in order to determine the route cost TC, and integrates the link costs LC along the candidate route 1B. In this case, if the integrated value exceeds a specified threshold value during the integration of the link costs LC, it is determined that the candidate route 1B is no longer a candidate for the set route 1A, and the calculation of subsequent link costs LC is discontinued. Note that it is preferable that the specified threshold value is set according to the distance from the current position to the destination.

(10) In the above description, an example is described in which when there are a plurality of candidate routes 1B, the route cost TC is obtained for all of the candidate routes 1B. However, the present invention is not limited to such a configuration. For example, a configuration is possible in which, in the case of a candidate route 1B whose total route length is a specified multiple or more of the shortest candidate route 1B, that candidate route 1B is not used as a candidate for the set route 1A, and the route cost TC is not obtained for that candidate route 1B.

(11) In the above description, an example is described in which the position information S of the article transport vehicle 3 is position information S read based on the detection object T. However, the present invention is not limited to such a configuration. A configuration is possible in which the position information S of the article transport vehicle 3 includes information on not only the position read based on the detection object T, but also the travel distance of the article transport vehicle 3 from that position. With this configuration, the controller H can acquire a more specific position of the article transport vehicle 3. Also, if the article transport vehicle 3 includes another position detector such as GPS (Global Positioning System), the position information S acquired by the position detector may be transmitted to the controller H.

(12) In the above description, an example is described in which the article transport vehicle 3 travels on the traveling rail 2 suspended from and supported by the ceiling. However, the present invention is not limited to such a configuration. For example, a configuration is possible in which the article transport vehicle 3 travels on the traveling rail 2 disposed in a manner other than being suspended from the ceiling, such as being supported on the floor surface. Also, instead of traveling on the traveling rail 2, the article transport vehicle 3 may travel in a trackless manner, such as traveling directly on the floor surface.

The following describes a summary of embodiments of the article transport facility described above.

In one aspect, an article transport facility according to an aspect of the present invention includes: a plurality of article transport vehicles configured to transport articles while traveling along a specified travelable route; and a controller configured to control the article transport vehicles, wherein the travelable route includes a plurality of nodes at which a route branches or routes merge, and a plurality of links that are each a route portion connecting a pair of nodes, the controller executes route setting control to set a set route based on a link cost set for each of the links, the set route being a route along which a setting vehicle, which is one of the plurality of article transport vehicles, travels to a destination on the travelable route, each of the link costs includes a reference cost and a variable cost, with a target vehicle being any one article transport vehicle that passes through a link, a target link being the link through which the target vehicle passes, and another vehicle being an article transport vehicle other than the target vehicle, the reference cost is a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, in the route setting control, the controller obtains the variable cost based on the number of target other vehicles and the other vehicle cost, obtains an adjusted variable cost by adjusting the variable cost using the priority adjustment value that is in accordance with the traveling purpose of the setting vehicle, determines the link cost for each link in a candidate route based on the adjusted variable cost and the reference cost, the candidate route being a candidate for the set route from the position of the setting vehicle at the setting time to the destination, obtains a route cost for each candidate route based on the link costs, and sets the set route based on the route cost of each candidate route.

According to this configuration, the adjusted variable cost is adjusted so as to increase as the priority for arriving more quickly at the destination decreases, in accordance with the traveling purpose of the setting vehicle. As a result, in the case of a setting vehicle having a low-priority traveling purpose, if a candidate route passes through a link that can possibly include many target other vehicles and be congested, the cost of that candidate route is higher than that in the case of a setting vehicle having a high-priority traveling purpose. For this reason, it is more likely for an article transport vehicle having a low-priority traveling purpose to take a route that avoids a link that may be congested, and it is possible to easily suppress the actual congestion level in the link that may be congested. As a result, it is easier to increase the degree of freedom when setting the set route of an article transport vehicle having a high-priority traveling purpose. Accordingly, it is possible to appropriately set, from a plurality of candidate routes, a set route that enables an article transport vehicle having a high-priority traveling purpose to preferentially travel via an efficient route and reach a destination more quickly.

Various technical features of this article transport facility can also be applied to a route setting method and a route setting program for route setting in the article transport facility, and also to a recording medium (a computer-readable recording medium) on which the route setting program is recorded. The following illustrates representative aspects. For example, the route setting method can include various steps that have the features of the article transport facility described above. Also, a route setting program and a storage medium storing the route setting program can cause a controller, which is a computer, to realize various functions having the above-described features of the article transport facility. As a matter of course, the aforementioned route setting method, route setting program, and recording medium having the route setting program recorded thereon can also achieve actions and effects of the article transport facility described above. Also, as preferred embodiments of the article transport facility, various additional features shown below can also be incorporated into a route setting method, a route setting program, and a storage medium, and the method, the program, and the recording medium can also achieve actions and effects corresponding to the additional features.

As one preferred aspect, a route setting method is for, in an article transport facility that includes a plurality of article transport vehicles that transport articles while traveling along a specified travelable route and a controller that controls the article transport vehicles, setting a set route for causing a setting vehicle, which is one of the article transport vehicles, to travel to a destination on the travelable route, by causing the controller to execute route setting control, the travelable route including a plurality of nodes at which a route branches or routes merge, and a plurality of links that are each a route portion connecting a pair of nodes, a link cost set for each of the links including a reference cost and a variable cost, with a target vehicle being any one article transport vehicle that passes through a link, a target link being the link through which the target vehicle passes, and another vehicle being an article transport vehicle other than the target vehicle, the reference cost being a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, the route setting method including: a step of obtaining the variable cost based on the number of target other vehicles and the other vehicle cost; a step of obtaining an adjusted variable cost by adjusting the variable cost using the priority adjustment value that is in accordance with the traveling purpose of the setting vehicle; a step of determining the link cost for each link in a candidate route based on the adjusted variable cost and the reference cost, the candidate route being a candidate for the set route from the position of the setting vehicle at the setting time to the destination; a step of obtaining a route cost for each candidate route based on the link costs; and a step of setting the set route based on the route cost of each candidate route.

Also, as another preferred aspect, a route setting program is for, in an article transport facility that includes a plurality of article transport vehicles that transport articles while traveling along a specified travelable route and a controller that controls the article transport vehicles, causing the controller to realize a function for setting a set route for causing a setting vehicle, which is one of the article transport vehicles, to travel to a destination on the travelable route, by execution of route setting control by the controller, the travelable route including a plurality of nodes at which a route branches or routes merge, and a plurality of links that are each a route portion connecting a pair of nodes, a link cost set for each of the links including a reference cost and a variable cost, with a target vehicle being any one article transport vehicle that passes through a link, a target link being the link through which the target vehicle passes, and another vehicle be an article transport vehicle other than the target vehicle, the reference cost being a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, the route setting program causing the controller to realize: a function of obtaining the variable cost based on the number of target other vehicles and the other vehicle cost; a function of obtaining an adjusted variable cost by adjusting the variable cost using the priority adjustment value that is in accordance with the traveling purpose of the setting vehicle; a function of determining the link cost for each link in a candidate route based on the adjusted variable cost and the reference cost, the candidate route being a candidate for the set route from the position of the setting vehicle at the setting time to the destination; a function of obtaining a route cost for each candidate route based on the link costs; and a function of setting the set route based on the route cost of each candidate route.

Also, as another preferred aspect, a storage medium has recorded thereon a route setting program for, in an article transport facility that includes a plurality of article transport vehicles that transport articles while traveling along a specified travelable route and a controller that controls the article transport vehicles, causing the controller to realize a function for setting a set route for causing a setting vehicle, which is one of the article transport vehicles, to travel to a destination on the travelable route, by execution of route setting control by the controller, the travelable route including a plurality of nodes at which a route branches or routes merge, and a plurality of links that are each a route portion connecting a pair of nodes, a link cost set for each of the links including a reference cost and a variable cost, with a target vehicle being any one article transport vehicle that passes through a link, a target link being the link through which the target vehicle passes, and another vehicle be an article transport vehicle other than the target vehicle, the reference cost being a value set based on a reference transit time indicating an amount of time required for the target vehicle to pass through the target link while the other vehicle is not present in the target link, with a setting time being a time at which the route setting control is executed, with an other vehicle cost being a value set according to an amount by which the time required for the target vehicle to pass through the target link increases per other vehicle present in the target link, with a target other vehicle being another vehicle deemed to be present in the target link, and with a priority adjustment value being a value set according to a traveling purpose of an article transport vehicle and furthermore set so as to increase continuously or stepwise as a priority for arriving more quickly at the destination decreases, the route setting program causing the controller to realize: a function of obtaining the variable cost based on the number of target other vehicles and the other vehicle cost; a function of obtaining an adjusted variable cost by adjusting the variable cost using the priority adjustment value that is in accordance with the traveling purpose of the setting vehicle; a function of determining the link cost for each link in a candidate route based on the adjusted variable cost and the reference cost, the candidate route being a candidate for the set route from the position of the setting vehicle at the setting time to the destination; a function of obtaining a route cost for each candidate route based on the link costs; and a function of setting the set route based on the route cost of each candidate route.

Here, it is preferable that there are a plurality of traveling purposes, including transport-related traveling for traveling to a destination set in order to receive an article or deliver an article, and retreat traveling for traveling to a destination set in order to clear a route for another article transport vehicle, and the priority adjustment value corresponding to the retreat traveling is set higher than the priority adjustment value corresponding to the transport-related traveling.

Retreat traveling that does not involve article transport generally has less need to reach the destination more quickly than transport-related traveling. In other words, retreat traveling has a lower priority for reaching the destination earlier than transport-related traveling. According to the above configuration, it is more likely for an article transport vehicle whose traveling purpose is eviction traveling to take a route that avoids a link that may be congested, and it is possible to easily suppress the actual congestion level in the link that may be congested. As a result, it is easier to increase the degree of freedom when setting the set route of an article transport vehicle whose traveling purpose is transport-related traveling. Accordingly, it is possible to make it more likely for an article transport vehicle whose traveling purpose is transport-related traveling to preferentially travel via an efficient route and reach a destination more quickly.

Also, it is preferable that there are a plurality of traveling purposes, including first transport-related traveling for traveling to a destination that is an article usage location, and second transport-related traveling for traveling to a destination that is an article storage location, and the priority adjustment value corresponding to the second transport-related traveling is set higher than the priority adjustment value corresponding to the first transport-related traveling.

In general, the need to reach the destination quickly is lower for traveling to an article storage location than for traveling to an article usage location. In other words, the priority of reaching the destination quickly is lower for traveling to an article storage location than for traveling to an article usage location. According to the above configuration, it is more likely for an article transport vehicle whose traveling purpose is second transport-related traveling, which is travel to an article storage location, to take a route that avoids a link that may be congested, and it is possible to easily suppress the actual congestion level in the link that may be congested. As a result, it is easier to increase the degree of freedom when setting the set route of an article transport vehicle whose traveling purpose is the first transport-related traveling, which is travel to an article usage location. Accordingly, it is possible to make it more likely for an article transport vehicle whose traveling purpose is first transport-related traveling, which is to be given higher priority, to preferentially travel via an efficient route and reach a destination more quickly.

Also, it is preferable that there are a plurality of traveling purposes, including: first delivery traveling for traveling to a destination that is an article usage location in order to deliver an article, first receiving traveling for traveling to a destination that is an article usage location in order to receive an article, second delivery traveling for traveling to a destination that is an article storage location in order to deliver an article, second receiving traveling for traveling to a destination that is an article storage location in order to receive an article, and retreat traveling for traveling to a destination set so as to clear a route for another article transport vehicle, and the priority adjustment value is set increasingly higher in above-stated order of traveling purposes.

According to this configuration, the variable cost can be appropriately adjusted according to the traveling purpose of the setting vehicle so that the adjusted variable cost increases as the priority of arrive more quickly at the destination decreases. In other words, it is possible to more appropriately set a set route from among a plurality of candidate routes so that an article transport vehicle having a high-priority traveling purpose is likely to preferentially travel via an efficient route and reach a destination more quickly.

Also, it is preferable that the controller sets, as the target other vehicle, another vehicle for which a set route passing through the target link has already been set.

Given that one set route is set for one article transport vehicle, a link that is included in the set route of the other vehicle and also included in the candidate route of the setting vehicle can be set as the target link through relatively simple processing.

Also, it is preferable that the controller sets, as the target other vehicle, another vehicle that is to travel simultaneously with the setting vehicle at a position in front of the setting vehicle, based on an arrival time of the setting vehicle at the target link estimated based on a route from a position of the setting vehicle at the setting time to the target link, and an arrival time of another vehicle at the target link estimated based on a route from a position of the other vehicle at the setting time to the target link.

According to this configuration, another vehicle that has a high possibility of actually affecting the traveling of the setting vehicle can be appropriately set as the target other vehicle.

Also, it is preferable that the controller obtains a density value by dividing the number of target other vehicles by a maximum value of the number of article transport vehicles that can be present in the target link, obtains an adjusted density value by adjusting the density value using the priority adjustment value that is in accordance with the traveling purpose of the setting vehicle, and, in the route setting control, corrects the link cost so as to increase as the density value increases.

According to this configuration, the congestion level of the target link, which is in accordance with the maximum value of the number of article transport vehicles that can be present in the target link, can be reflected in the link cost. In other words, the link cost can be corrected such that the link cost increases as the density value increases, thus making it unlikely for a candidate route that includes a link having a high density value to be set as the set route, and making it possible to reduce the possibility that congestion frequently occurs in a specific link. In the above configuration, the link cost can be further corrected so as to increase as the adjustment density value adjusted by the priority adjustment value increases, and therefore as the priority of arriving more quickly at the destination decreases, it is less likely for a route that passes through a congested link to be selected as the set route of the setting vehicle. As a result, the possibility of congestion in the link is reduced, and it is possible to make it more likely for an article transport vehicle having a high-priority traveling purpose to preferentially travel via an efficient route and reach a destination more quickly.

Also, it is preferable that the article transport facility further includes a power supply line configured to supply power to the article transport vehicles and provided along the travelable route, wherein the travelable route is divided into a plurality of power supply areas, an area maximum number of vehicles is set for each of the power supply areas, and the number of article transport vehicles to which power is suppliable in each of the power supply areas is less than or equal to the area maximum number of vehicles of the corresponding power supply area, and in a case where the number of other vehicles deemed to be present in a target power supply area, which is one of the power supply areas, is greater than or equal to the area maximum number of vehicles of the target power supply area, in the route setting control, the controller executes power supply area correction processing to correct the link cost of a link included in the target power supply area so as to be higher than the link cost of a link not included in the target power supply area.

According to this configuration, if there is a possibility that the number of article transport vehicles in a power supply area will become greater than or equal to the number of vehicles to which power can be supplied, it is possible to reduce the possibility that a route passing through that power supply area is set. If the number of article transport vehicles in a power supply area reaches the maximum number of vehicles to which power can be supplied, entry into that power supply area is restricted, and an article transport vehicle may be stopped immediately in front of the power supply area instead of entering the power supply area. However, according to the above configuration, if the number of other vehicles deemed to be present in the target power supply area is greater than or equal to the area maximum number of vehicles in the target power supply area, power supply area correction processing is executed to increase the link cost of the link in that target power supply area, thus making it possible to reduce the possibility that entry of an article transport vehicle into the power supply area is restricted as described above. As a result, it is possible to make it more likely for an article transport vehicle having a high-priority traveling purpose to preferentially travel via an efficient route and reach a destination more quickly.

What is claimed is:

1. An article transport facility comprising:
a plurality of article transport vehicles configured to transport articles while traveling along a specified travelable route; and
a controller configured to control the article transport vehicles,
wherein:
the travelable route includes a plurality of nodes at which a route branches or routes merge, and a plurality of links that are each a route portion connecting a pair of nodes,
the controller executes route setting control to set a set route based on a link cost set for each of the links, the set route is a route along which a setting vehicle, which is one of the plurality of article transport vehicles, travels to a destination on the travelable route,
each of the link costs includes a reference cost and a variable cost,
a target vehicle is any one article transport vehicle that passes through a link, a target link is the link through which the target vehicle passes, and another vehicle is an article transport vehicle other than the target vehicle,
the reference cost is a value set based on a reference transit time indicating an amount of time required for the target vehicle to pass through the target link while the other vehicle is not present in the target link,
a setting time is a time at which the route setting control is executed,
an other vehicle cost is a value set according to an amount by which the time required for the target vehicle to pass through the target link increases per other vehicle present in the target link,
a target other vehicle is another vehicle deemed to be present in the target link, and
a priority adjustment value is a value set according to a traveling purpose of an article transport vehicle and furthermore set so as to increase continuously or stepwise as a priority for arriving more quickly at the destination decreases,
in the route setting control, the controller obtains the variable cost based on the number of target other vehicles and the other vehicle cost, obtains an adjusted variable cost by adjusting the variable cost using the priority adjustment value that is in accordance with the traveling purpose of the setting vehicle, determines the link cost for each link in a candidate route based on the adjusted variable cost and the reference cost, the candidate route is a candidate for the set route from the position of the setting vehicle at the setting time to the destination, obtains a route cost for each candidate route based on the link costs, and sets the set route based on the route cost of each candidate route.

2. The article transport facility according to claim 1,
wherein there are a plurality of traveling purposes, including transport-related traveling for traveling to a destination set in order to receive an article or deliver an article, and retreat traveling for traveling to a destination set in order to clear a route for another article transport vehicle, and
wherein the priority adjustment value corresponding to the retreat traveling is set higher than the priority adjustment value corresponding to the transport-related traveling.

3. The article transport facility according to claim 1,
wherein there are a plurality of traveling purposes, including first transport-related traveling for traveling to a destination that is an article usage location, and second transport-related traveling for traveling to a destination that is an article storage location, and
wherein the priority adjustment value corresponding to the second transport-related traveling is set higher than the priority adjustment value corresponding to the first transport-related traveling.

4. The article transport facility according to claim 1,
wherein there are a plurality of traveling purposes, comprising:
first delivery traveling for traveling to a destination that is an article usage location in order to deliver an article,
first receiving traveling for traveling to a destination that is an article usage location in order to receive an article,
second delivery traveling for traveling to a destination that is an article storage location in order to deliver an article,
second receiving traveling for traveling to a destination that is an article storage location in order to receive an article, and
retreat traveling for traveling to a destination set so as to clear a route for another article transport vehicle, and
wherein the priority adjustment value is set increasingly higher in above-stated order of traveling purposes.

5. The article transport facility according to claim 1,
wherein the controller sets, as the target other vehicle, another vehicle for which a set route passing through the target link has already been set.

6. The article transport facility according to claim 1,
wherein the controller sets, as the target other vehicle, another vehicle that is to travel simultaneously with the setting vehicle at a position in front of the setting vehicle, based on an arrival time of the setting vehicle at the target link estimated based on a route from a position of the setting vehicle at the setting time to the target link, and an arrival time of another vehicle at the target link estimated based on a route from a position of the other vehicle at the setting time to the target link.

7. The article transport facility according to claim 1, wherein the controller obtains a density value by dividing the number of target other vehicles by a maximum value of the number of article transport vehicles that can be present in the target link, obtains an adjusted density value by adjusting the density value using the priority adjustment value that is in accordance with the traveling purpose of the setting vehicle, and, in the route setting control, corrects the link cost so as to increase as the density value increases.

8. The article transport facility according to claim 1, further comprising a power supply line configured to supply power to the article transport vehicles and provided along the travelable route,
wherein the travelable route is divided into a plurality of power supply areas, an area maximum number of vehicles is set for each of the power supply areas, and the number of article transport vehicles to which power is suppliable in each of the power supply areas is less than or equal to the area maximum number of vehicles of the corresponding power supply area, and
wherein in a case where the number of other vehicles deemed to be present in a target power supply area, which is one of the power supply areas, is greater than or equal to the area maximum number of vehicles of the target power supply area, in the route setting control, the controller executes power supply area correction processing to correct the link cost of a link included in the target power supply area so as to be higher than the link cost of a link not included in the target power supply area.

9. A route setting method for, in an article transport facility that comprises a plurality of article transport vehicles that transport articles while traveling along a specified travelable route and a controller that controls the article transport vehicles, setting a set route for causing a setting vehicle, which is one of the article transport vehicles, to travel to a destination on the travelable route, by causing the controller to execute route setting control,
the travelable route including a plurality of nodes at which a route branches or routes merge, and a plurality of links that are each a route portion connecting a pair of nodes,
a link cost set for each of the links including a reference cost and a variable cost,
wherein:
a target vehicle is any one article transport vehicle that passes through a link, a target link is the link through which the target vehicle passes, and another vehicle is an article transport vehicle other than the target vehicle,
the reference cost is a value set based on a reference transit time indicating an amount of time required for the target vehicle to pass through the target link while the other vehicle is not present in the target link,
a setting time is a time at which the route setting control is executed,
an other vehicle cost is a value set according to an amount by which the time required for the target vehicle to pass through the target link increases per other vehicle present in the target link,
a target other vehicle is another vehicle deemed to be present in the target link, and a priority adjustment value is a value set according to a traveling purpose of an article transport vehicle and furthermore set so as to increase continuously or stepwise as a priority for arriving more quickly at the destination decreases,
the route setting method comprising:
obtaining the variable cost based on the number of target other vehicles and the other vehicle cost;
obtaining an adjusted variable cost by adjusting the variable cost using the priority adjustment value that is in accordance with the traveling purpose of the setting vehicle;
determining the link cost for each link in a candidate route based on the adjusted variable cost and the reference cost, the candidate route is a candidate for the set route from the position of the setting vehicle at the setting time to the destination;
obtaining a route cost for each candidate route based on the link costs; and
setting the set route based on the route cost of each candidate route.

10. A route setting program product comprising at least one non-transitory computer-readable storage medium including instruction for, in an article transport facility that comprises a plurality of article transport vehicles that transport articles while traveling along a specified travelable route and a controller that controls the article transport vehicles, causing the controller to set a set route for causing a setting vehicle, which is one of the article transport vehicles, to travel to a destination on the travelable route, by execution of route setting control by the controller,
the travelable route including a plurality of nodes at which a route branches or routes merge, and a plurality of links that are each a route portion connecting a pair of nodes,
a link cost set for each of the links including a reference cost and a variable cost,
wherein:
a target vehicle is any one article transport vehicle that passes through a link, a target link is the link through which the target vehicle passes, and another vehicle is an article transport vehicle other than the target vehicle,
the reference cost is a value set based on a reference transit time indicating an amount of time required for the target vehicle to pass through the target link while the other vehicle is not present in the target link,
a setting time is a time at which the route setting control is executed,
an other vehicle cost is a value set according to an amount by which the time required for the target vehicle to pass through the target link increases per other vehicle present in the target link,
a target other vehicle is another vehicle deemed to be present in the target link, and
a priority adjustment value is a value set according to a traveling purpose of an article transport vehicle and furthermore set so as to increase continuously or stepwise as a priority for arriving more quickly at the destination decreases,
the route setting program, when executed by at least one processor of the controller, causes the controller to:
obtain the variable cost based on the number of target other vehicles and the other vehicle cost;
obtain an adjusted variable cost by adjusting the variable cost using the priority adjustment value that is in accordance with the traveling purpose of the setting vehicle;

determine the link cost for each link in a candidate route based on the adjusted variable cost and the reference cost, the candidate route is a candidate for the set route from the position of the setting vehicle at the setting time to the destination;

obtain a route cost for each candidate route based on the link costs; and set the set route based on the route cost of each candidate route.

* * * * *